(12) United States Patent
Takahashi et al.

(10) Patent No.: US 9,214,536 B2
(45) Date of Patent: Dec. 15, 2015

(54) LATERAL INSULATED GATE BIPOLAR TRANSISTOR

(71) Applicant: DENSO CORPORATION, Kariya, Aichi-pref. (JP)

(72) Inventors: Shigeki Takahashi, Okazaki (JP); Norihito Tokura, Okazaki (JP); Satoshi Shiraki, Toyohashi (JP); Youichi Ashida, Nukata-gun (JP); Akio Nakagawa, Chigasaki (JP)

(73) Assignee: DENSO CORPORATION, Karyia (JP)

( * ) Notice: Subject to any disclaimer, the term of this patent is extended or adjusted under 35 U.S.C. 154(b) by 0 days.

(21) Appl. No.: 14/077,510

(22) Filed: Nov. 12, 2013

(65) Prior Publication Data
US 2014/0070271 A1 Mar. 13, 2014

Related U.S. Application Data

(62) Division of application No. 13/114,148, filed on May 24, 2011, now abandoned.

(30) Foreign Application Priority Data

May 26, 2010 (JP) ................................. 2010-120545
Sep. 29, 2010 (JP) ................................. 2010-219357

(51) Int. Cl.
*H01L 29/66* (2006.01)
*H01L 29/739* (2006.01)
*H01L 29/06* (2006.01)
(Continued)

(52) U.S. Cl.
CPC ........ *H01L 29/7393* (2013.01); *H01L 29/0696* (2013.01); *H01L 29/0834* (2013.01); *H01L 29/1095* (2013.01); *H01L 29/405* (2013.01); *H01L 29/7394* (2013.01)

(58) Field of Classification Search
CPC ............ H01L 29/7393; H01L 29/7394; H01L 29/1095; H01L 29/0696
USPC ........... 257/141, 139, 343, 557, 575, E21.382
See application file for complete search history.

(56) References Cited

U.S. PATENT DOCUMENTS 5,438,220 A 8/1995 Nakagawa et al.
5,592,014 A 1/1997 Funaki et al.
(Continued)

FOREIGN PATENT DOCUMENTS

| EP | 0837508 A2 | 4/1998 |
| EP | 1895595 A2 | 3/2008 |
| JP | 3395520 B2 | 2/2003 |

OTHER PUBLICATIONS

Office Action mailed Apr. 22, 2014 in the corresponding JP application No. 2010-219357 (with English translation).

*Primary Examiner* — Fernando L Toledo
*Assistant Examiner* — Aaron Gray
(74) *Attorney, Agent, or Firm* — Posz Law Group, PLC

(57) ABSTRACT

A lateral insulated gate bipolar transistor includes a semiconductor substrate including a drift layer, a collector region, a channel layer, an emitter region, a gate insulating layer, a gate electrode, a collector electrode, an emitter electrode, and a barrier layer. The barrier layer is disposed along either side of the collector region and is located to a depth deeper than a bottom of the channel layer. The barrier layer has an impurity concentration that is higher than an impurity concentration of the drift layer. The barrier layer has a first end close to the collector region and a second end far from the collector region. The first end is located between the channel layer and the collector region, and the second end is located on the bottom of the channel layer.

8 Claims, 23 Drawing Sheets

(51) Int. Cl.
*H01L 29/08* (2006.01)
*H01L 29/10* (2006.01)
*H01L 29/40* (2006.01)

(56) References Cited

U.S. PATENT DOCUMENTS

| | | | |
|---|---|---|---|
| 5,640,040 A | 6/1997 | Nakagawa et al. | |
| 5,731,603 A | 3/1998 | Nakagawa et al. | |
| 5,796,125 A * | 8/1998 | Matsudai et al. | |
| 6,133,607 A * | 10/2000 | Funaki et al. | 257/343 |
| 2001/0023960 A1 | 9/2001 | Soga et al. | |
| 2008/0246086 A1* | 10/2008 | Korec et al. | 257/343 |
| 2008/0265278 A1 | 10/2008 | Hara et al. | |
| 2009/0008675 A1* | 1/2009 | Lu | 257/141 |
| 2009/0242930 A1* | 10/2009 | Lu | 257/141 |
| 2010/0032713 A1* | 2/2010 | Kawahara et al. | 257/141 |

* cited by examiner

LATERAL INSULATED GATE BIPOLAR TRANSISTOR

CROSS REFERENCE TO RELATED APPLICATION APPLICATIONS

The present application is a divisional of application Ser. No. 13/114,148 filed on May 24, 2011 which is based on and claims priority to Japanese Patent Applications No. 2010-120545 filed on May 26, 2010 and No. 2010-219357 filed on Sep. 29, 2010, the contents of which are incorporated in their entirety herein by reference.

BACKGROUND OF THE INVENTION

1. Field of the Invention

The present invention relates to a lateral insulated gate bipolar transistor (lateral IGBT).

2. Description of the Related Art

Japanese Patent No. 3,522,983 (corresponding to U.S. Pat. No. 5,731,603 and referred to as a patent document 1 hereafter) discloses a lateral IGBT in which the number of channels is increased to reduce an on-voltage. The patent document 1 also discloses that preventing operation of a parasitic thyristor is important to improve a latch-up immunity. This is because a current density in silicon in a lateral IGBT is much higher than a current density in silicon in a vertical IGBT. In a vertical IGBT, because electric current flows in a normal direction of a substrate, a cross-sectional area in which electric current flows is large, and a current density is not high. In a lateral IGBT, because electric current flows in a horizontal direction of a substrate, a cross-sectional area in which electric current flows depends on a thickness of the substrate, and a current density is high.

In a vertical IGBT, as disclosed in Japanese Patent No. 3,395,520 (referred to as a patent document 2 hereafter), a resistance of a silicon layer is reduced by forming an high impurity concentration region around an emitter region. A similar technique is disclosed in Japanese Unexamined Patent Application Publication No. 10-178174 (corresponding to Europe Unexamined Patent Application Publication No. 0387508A2 and referred to as a patent document 3 hereafter), and the above-described technique is applied to a lateral IGBT. In Japanese Unexamined Patent Application Publication No. 2008-270377 (corresponding to US Unexamined Patent Application Publication No. 2008/0265278 A1 and referred to as a patent document 4 hereafter), an example in which the above-described technique is applied to a lateral IGBT having a different structure. The patent document 4 discloses a technique that focuses on a specialty of a lateral IGBT and a short circuit capacity as one of breakdown endurance can be improved by controlling a gate electrode.

Because a current density in a lateral IGBT at operation is much higher than a current density in a vertical IGBT at operation, the lateral IGBT has difficulty in securing a breakdown endurance. Furthermore, due to a high current density, an on-state breakdown voltage and a transitive-state breakdown voltage are reduced, and a switching speed is reduced. Thus, a local dynamic avalanche easily occurs in a lateral IGBT at switching compared with a vertical IGBT. Therefore, there is a trade-off relationship between reduction of an on-voltage and extension of a turning-off time, an on-state breakdown voltage and a transitive-state breakdown voltage. It is important to achieve high trade-off balance.

In order to reduce an on-voltage of a lateral IGBT, a carrier concentration in an n− type drift layer in the vicinity of an emitter is increased. Thus, it is required to restrict holes from flowing to a channel p well layer and to facilitate accumulation of carriers. In other words, because the on-voltage increases when the carrier concentration in the n− type drift layer in the vicinity of the emitter decreases, it is important to increase the carrier concentration in the n-type drift layer in the vicinity of the emitter. A method of increasing the carrier concentration in the n− type drift layer in the vicinity of the emitter includes (i) narrowing the channel p well layer so as to narrow a region from which holes are extracted or (ii) arranging an n type hole barrier layer between the channel p well layer and the n− type drift layer so that extraction of holes is restricted.

Although the patent document 2 discloses that forming a high impurity concentration region around an emitter region can be applied to a lateral IGBT also, a specific application structure of the lateral IGBT is not suggested. This method corresponds to the above-described method (ii), the patent document 2 discloses only a DC characteristic, and it is not clear how to apply the above-described method (ii) to the lateral IGBT. The patent documents 2 and 3 are based on a vertical IGBT and do not take measures against that the current density in the lateral IGBT is much higher than the current density in the vertical IGBT. The patent document 4 only contrives a control method of a gate electrode and cannot cancel the tradeoff relationship with a demerit of increasing an on-voltage.

SUMMARY OF THE INVENTION

In view of the foregoing problems, it is an object of the present invention to provide a lateral IGBT in which an on-voltage can be reduced, a breakdown endurance can be secured, and a switching speed can be increased at the same time.

A lateral IGBT according to a first aspect of the present invention includes a plurality of cells, and each of the cells includes a semiconductor substrate, a collector region, a channel layer, an emitter region, a gate insulating layer, a gate electrode, a collector electrode, an emitter electrode, and a barrier layer. The semiconductor substrate includes a drift layer of a first conductivity type. The collector region of a second conductivity type is disposed in a surface portion of the drift layer and has a longitudinal direction in a predetermined direction. The channel layer of the second conductivity type is disposed in the surface portion of the drift layer. The channel layer includes a linear portion extending along either side of the collector region. The emitter region of the first conductivity type is disposed in a surface portion of the channel layer. An end of the emitter region is located inside an end of the channel layer. The emitter region includes a linear portion that has a longitudinal direction in the predetermined direction. The gate insulating layer is disposed on a surface of the channel layer located between the emitter region and the drift layer. The gate electrode is disposed on a surface of the gate insulating layer. The collector electrode is electrically coupled with the collector region. The emitter electrode is electrically coupled with the emitter region and the channel layer. The barrier layer of the first conductivity type is disposed along either side of the collector region. The burrier layer is located to a depth deeper than a bottom of the channel layer. The barrier layer has a first conductivity-type impurity concentration that is higher than a first conductivity-type impurity concentration of the drift layer. The barrier layer has a first end close to the collector region and a second end far from the collector region. The first end is located between the channel layer and the collector region. The second end is located on the bottom of the channel layer. The plurality of cells includes a first cell and a second cell adjacent to each other. The emitter region and the channel layer in the first cell are arranged along with the emitter region and the channel layer in the second cell. The channel layer in the first cell is located at a predetermined distance from the channel layer in the second cell.

In the lateral IGBT according to the first aspect, an on-voltage can be reduced with increasing a carrier concentration in the vicinity of an emitter by disposing the barrier layer. In addition, because the barrier layer is not disposed a between adjacent emitters, a turning-off time can be improved. Furthermore, a breakdown endurance at switching can be improved. Thus, in the lateral IGBT according to the first aspect, the on-voltage can be reduced, the breakdown endurance can be secured, and the switching speed can be increased at the same time.

A lateral IGBT according to a second aspect of the present invention includes a plurality of cells, and each of the cells includes a semiconductor substrate, a collector region, a channel layer, an emitter region, a gate insulating layer, a gate electrode, a collector electrode, an emitter electrode, and a barrier layer. The semiconductor substrate includes a drift layer of a first conductivity type. The collector region of a second conductivity type is disposed in a surface portion of the drift layer and has a longitudinal direction in a predetermined direction. The channel layer of the second conductivity type is disposed in the surface portion of the drift layer. The channel layer includes a linear portion extending along either side of the collector region. The emitter region of the first conductivity type is disposed in a surface portion of the channel layer. An end of the emitter region is located inside an end of the channel layer. The emitter region includes a linear portion that has a longitudinal direction in the predetermined direction. The gate insulating layer is disposed on a surface of the channel layer located between the emitter region and the drift layer. The gate electrode is disposed on a surface of the gate insulating layer. The collector electrode is electrically coupled with the collector region. The emitter electrode is electrically coupled with the emitter region and the channel layer. The barrier layer of the first conductivity type is disposed along either side of the collector region. The burrier layer is located to a depth deeper than a bottom of the channel layer. The barrier layer has a first conductivity type impurity concentration that is higher than a first conductivity type impurity concentration of the drift layer. The barrier layer includes a linear portion that has a longitudinal direction in the predetermined direction. The linear portion has a first conductivity type impurity peak concentration from $2 \times 10^{15}$ cm$^{-3}$ to $1.5 \times 10^{16}$ cm$^{-3}$. The plurality of cells includes a first cell and a second cell adjacent to each other. The emitter region and the channel layer in the first cell are arranged along with the emitter region and the channel layer located in the second cell. The channel layer in the first cell is located at a predetermined distance from the channel layer in the second cell. The barrier layer covers the channel layer in the first cell and the channel layer in the second cell and is disposed also between the channel layer in the first cell and the channel layer in the second cell.

Also in the lateral IGBT according to the second aspect, the on-voltage can be reduced, the breakdown endurance can be secured, and the switching speed can be increased at the same time.

A lateral IGBT according to a third aspect of the present invention includes a plurality of cells, and each of the cells includes a semiconductor substrate, a collector region, a channel layer, an emitter region, a gate insulating layer, a gate electrode, a collector electrode, an emitter electrode, and a trench. The semiconductor substrate includes a drift layer of a first conductivity type. The collector region of a second conductivity type is disposed in a surface portion of the drift layer. The collector region has a longitudinal direction in a predetermined direction. The channel layer of the second conductivity type is disposed in the surface portion of the drift layer. The channel layer includes a linear portion extending along either side of the collector region. The emitter region of the first conductivity type is disposed in a surface portion of the channel layer. An end of the emitter region is located inside an end of the channel layer. The emitter region includes a linear portion that has a longitudinal direction in the predetermined direction. The channel region is provided on a surface of the channel layer between the emitter region and the drift layer. The gate insulating layer is disposed on a surface of the channel region. The gate electrode is disposed on a surface of the gate insulating layer. The collector electrode is electrically coupled with the collector region. The emitter electrode is electrically coupled with the emitter region and the channel layer. The trench is provided from an end of the emitter region adjacent to the channel region. The trench has a corner portion at a bottom of the trench, and the corner portion having a radius of curvature of greater than or equal to 0.5 µm. The plurality of cells includes a first cell and a second cell adjacent to each other. The emitter region and the channel layer in the first cell are arranged along with the emitter region and the channel layer in the second cell. The channel layer in the first cell is located at a predetermined distance from the channel layer in the second cell. The gate insulating layer and the gate electrode are disposed in the trench and the channel region is provided on the surface of the channel layer located on a sidewall of the trench.

Also in the lateral IGBT according to the third aspect, the on-voltage can be reduced, the breakdown endurance can be secured, and the switching speed can be increased at the same time.

A lateral IGBT according to a fourth aspect of the present invention includes a plurality of cells, and each of the cells includes a semiconductor substrate, a collector region, a channel layer, an emitter region, a gate insulating layer, a gate electrode, a collector electrode, an emitter electrode, and a barrier layer. The semiconductor substrate includes a drift layer of a first conductivity type. The collector region of a second conductivity type is disposed in a surface portion of the drift layer. The collector region has a longitudinal direction in a predetermined direction. The channel layer of the second conductivity type is disposed in the surface portion of the drift layer. The channel layer includes a linear portion extending along either side of the collector region. The emitter region of the first conductivity type is disposed in a surface portion of the channel layer. An end of the emitter region is located inside an end of the channel layer. The emitter region includes a linear portion that has a longitudinal direction in the predetermined direction. The gate insulating layer is disposed on a surface of the channel layer located between the emitter region and the drift layer. The gate electrode is disposed on a surface of the gate insulating layer. The collector electrode is electrically coupled with the collector region. The emitter electrode is electrically coupled with the emitter region and the channel layer. The barrier layer of the first conductivity type is disposed along either side of the collector region. The burrier layer is located to a depth deeper than a bottom of the channel layer. The barrier layer has a first conductivity type impurity concentration that is higher than a first conductivity type impurity concentration of the drift layer. The barrier layer includes a liner portion that has a longitudinal direction in the predetermined direction and a corner portion that surrounds a longitudinal end of the collector region. The plurality of cells includes a first cell and a second cell adjacent to each other. The emitter region and the channel layer in the first cell are arranged along with the emitter region and the channel layer in the second cell. The channel layer in the first cell is located at a predetermined distance from the channel layer in the second cell. The linear portion of the barrier layer covers the channel layer in the first cell and the channel layer in the second cell and is disposed also between the channel layer in the first cell and the channel layer in the second cell. The corner portion of the barrier layer has a first end close to the collector region and a second end far from the collector region. The first end is located between the channel layer and the collector region, and the second end is located on the bottom of the channel layer.

Also in the lateral IGBT according to the fourth aspect, the on-voltage can be reduced, the breakdown endurance can be secured, and the switching speed can be increased at the same time.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
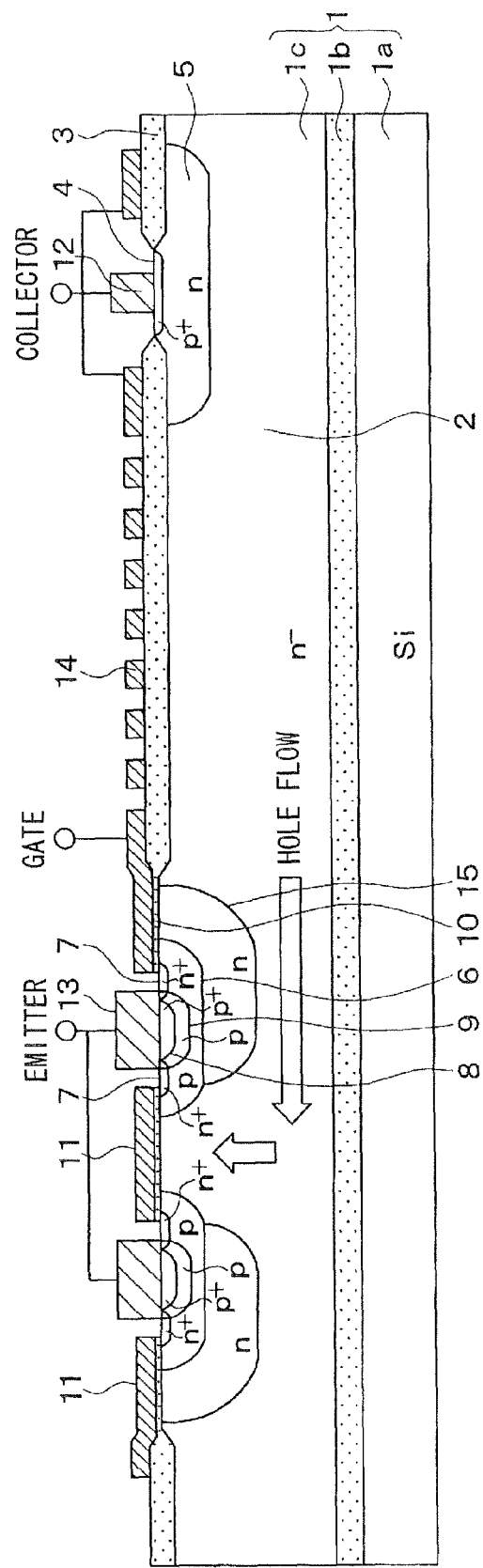
FIG. 1 is a cross-sectional view of a semiconductor device that includes a lateral IGBT according to a first embodiment of the present invention.

A lateral IGBT according to a first embodiment of the present invention will be described with reference to FIG. 1 and FIG. 2. FIG. 1 is a cross-sectional view of a semiconductor device including the lateral IGBT according to the present embodiment. FIG. 1 corresponds to a cross-sectional view of the semiconductor device taken along line I-I in FIG. 2.

As shown in FIG. 1, in the present embodiment, the lateral IGBT is formed using a silicon-on-insulator (SOI) substrate 1. The SOI substrate 1 includes a support substrate 1a made of, for example, silicon, a buried oxide layer 1b disposed on the support substrate 1a, and an active layer 1c made of silicon and disposed on the buried oxide layer 1b. The active layer 1c operates as an n− type drift layer 2. Each component in the lateral IGBT is disposed at a surface portion of the n− type drift layer 2.

In the SOI substrate 1, the buried oxide layer 1b can have any thickness and the active layer 1c (the n− type drift layer 2) can have any thickness and any n type impurity concentration. The thicknesses and the n type impurity concentration may be determined so that the lateral IGBT has a predetermined breakdown voltage. In order to have a high breakdown voltage, it is preferred that the buried oxide layer 1b has a thickness of greater than or equal to 4 µm. In particular, in order to have a breakdown voltage of greater than or equal to 600 V stably, it is preferred that the buried oxide layer 1b has a thickness of greater than or equal to 5 µm. With regard to the active layer 1c, in order to have a breakdown voltage of greater than or equal to 600 V, it is preferred that an n type impurity concentration is within a range from $1\times10^{14}$ cm$^{-3}$ to $1.2\times10^{15}$ cm$^{-3}$ in a case where a thickness is less than or equal to 15 µm and it is preferred that the n type impurity concentration is from $1\times10^{14}$ cm$^{-3}$ to $8\times10^{14}$ cm$^{-3}$ in a case where the thickness is 20 µm.

On the surface of the n− type drift layer 2, a LOCOS (local oxidation of silicon) oxide layer 3 is disposed. The LOCOS oxide layer 3 separates each component in the lateral IGBT. At a part of a surface portion of the n− type drift layer where the LOCOS oxide layer 3 is not disposed, a collector region 4 of p+ type is disposed. The collector region 4 extends in one direction (hereafter, referred to as a longitudinal direction). The collector region 4 is surrounded by an n type buffer layer 5. The n type buffer layer 5 has an impurity concentration higher than the n− type drift layer 2.

At another part of the surface portion of the n− type drift layer 2 where the LOCOS oxide layer 3 is not disposed, a channel p well layer 6, an n+ type emitter region 7, a p+ type contact layer 8, and a p type body layer 9 are disposed around the collector region 4.

On a surface of the channel p well layer 6, a channel region is provided. For example, the channel p well layer 6 has a thickness of less than or equal to 2 µm and a width of less than or equal to 6 µm. The channel p well layer 6 makes a circuit around the collector region 4 and a collector electrode 12 that is disposed on the collector region 4.

The n+ type emitter region 7 is disposed at a surface portion of the channel p well layer 6. An end of the n+ type emitter region 7 is located inside of an end of the channel p well layer 6. The n+ type emitter region 7 extends in the longitudinal direction of the collector region 4. As shown in FIG. 2, the n+ type emitter region 7 has a linear shape and is arranged in parallel with the collector region 4. The n+ type emitter region 7 is not disposed at a corner portion of the collector region 4, that is, the n+ type emitter region 7 is not disposed around two longitudinal ends of the collector region 4. In the present embodiment, the p+ type contact layer 8 and the p type body layer 9 are disposed between two linear portions of the n+ type emitter region 7.

The p+ type contact layer 8 is provided for fixing the channel p well layer 6 to an emitter potential. The p+ type contact layer 8 has an impurity concentration higher than the channel p well layer 6. The p+ type contact layer 8 also makes a circuit around the collector region 4 and the collector electrode 12.

The p type body layer 9 reduces a voltage drop caused by hole current that flows from a collector to an emitter through a surface of the lateral IGBT. The p type body layer 9 also makes a circuit around the collector region 4 and the collector electrode 12. The p type body layer 9 can restrict operation of a parasitic npn transistor provided by the n+ type emitter region 7, the channel p well layer 6, and the n− type drift layer 2, and a turning-off time can be improved.

Figure 2:
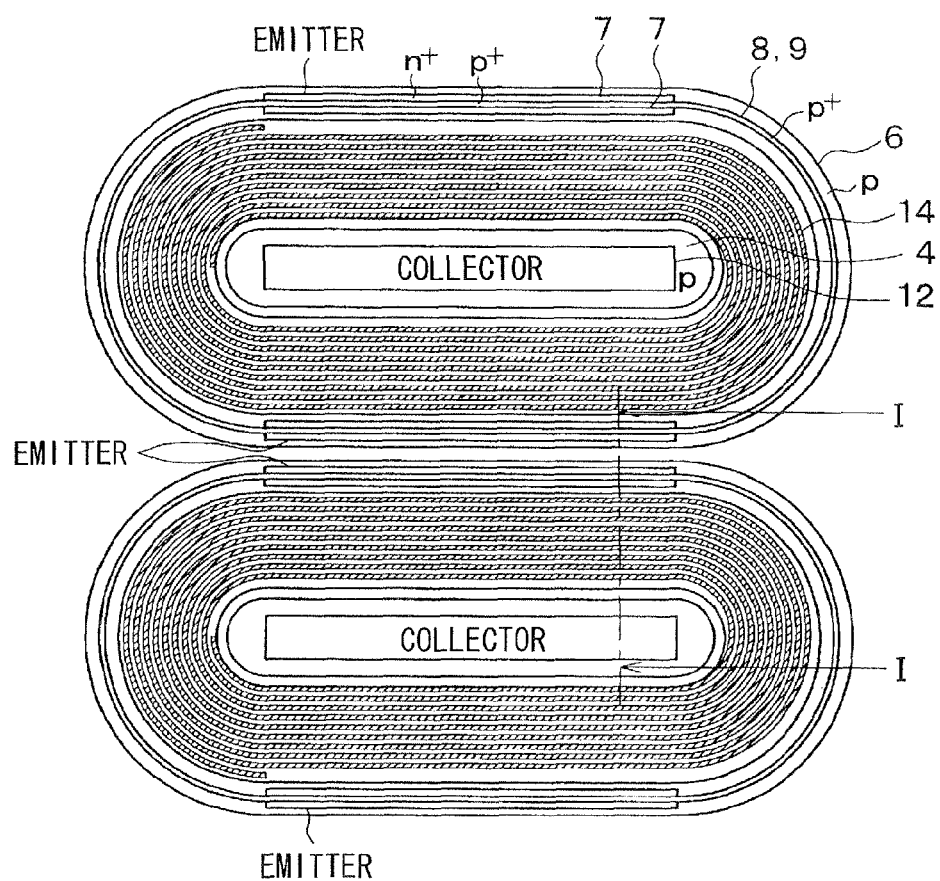
FIG. 2 is a diagram showing a top layout the semiconductor device shown in FIG. 1.

As shown in FIG. 2, the channel p well layer 6, n+ type emitter region 7, the p+ type contact layer 8, and the p type body layer 9 are arranged along either side of the collector region 4 and the collector electrode 12 in each cell. Thus, in a boundary portion of adjacent cells, two groups of the channel p well layer 6, the n+ type emitter region 7, the p+ type contact layer 8, and the p type body layer 9 are arranged along with each other.

On the surface of the channel p well layer 6, the gate electrode 11 made of, for example, doped polysilicon is disposed through a gate insulating layer 10. By applying a gate voltage to the gate electrode 11, the channel region is provided at the surface portion of the channel p well layer 6.

On a surface of the collector region 4, the collector electrode 12 electrically coupled with the collector region 4 is disposed. On the surfaces of the n+ type emitter region 7 and the p+ type contact layer 8, an emitter electrode 13 electrically coupled with the n+ type emitter region 7 and the p+ type contact layer 8 is disposed. In the cross-sectional view shown in FIG. 1, because a group of the channel p well layer 6, the n+ type emitter region 7, the p+ type contact layer 8, and the p type body layer 9 is provided for each of adjacent two collectors, two emitter electrodes 13 are arranged in parallel and the two emitter electrodes 13 are electrically coupled with each other.

On a surface of the LOCOS oxide layer 3 disposed between the collector and the gate, a resistive layer 14 made of doped polysilicon is disposed so as to restrict a potential gradient bias between the collector and the gate. As shown in FIG. 2, the resistive layer 14 has a spiral shape formed around the collector electrode 12. An end portion of the resistive layer 14 is electrically coupled with the collector electrode 12, and the other end portion of the resistive layer 14 is electrically coupled with the gate electrode 11. Thus, the end portion of the resistive layer 14 electrically coupled with the collector electrode 12 has a collector potential, and the potential of the resistive layer 14 gradually decreases from the collector potential toward the emitter potential due to an internal resistance. Thus, the potential of the resistive layer 14 depends on a distance from the collector electrode 12, and an a potential gradient of the n− type drift layer located under the resistive layer 14 through the LOCOS oxide layer 3 is maintained at a constant gradient. Therefore, the lateral IGBT according to the present embodiment can restrict an electric field concentration due to a potential gradient and can improve a breakdown voltage. Furthermore, the lateral IGBT can restrict impact ionization and can restrict an increase in a turning-off time.

Figure 3:
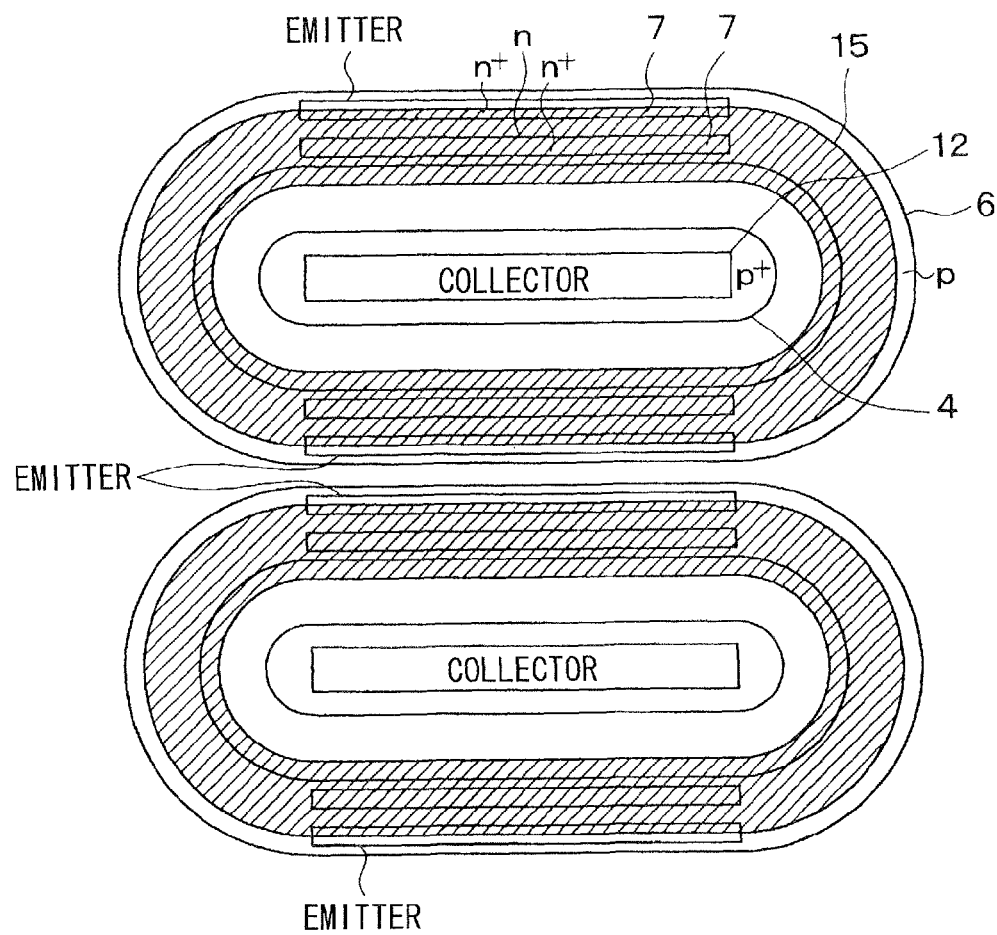
FIG. 3 is a diagram showing a top layout of components including an n type barrier layer.

The lateral IGBT further includes an n type barrier layer 15. The n type barrier layer 15 is located to a depth deeper than the channel p well layer 6. FIG. 3 is a diagram showing a top layout of the n type barrier layer 15. Although the diagram in FIG. 3 is not a cross-sectional view, the n type barrier layer 15 is illustrated with hatching so as to facilitate visualization.

The n type barrier layer 15 makes a circuit around the collector region 4. The n type barrier layer 15 has a first end close to the collector region 4 and a second end far from the collector region 4. The first end of the n type barrier layer 15 is located between the channel p well layer 6 and the collector region 4, that is, the first end of the n type barrier layer 15 is close to the collector region 4 compared with the end of the channel p well layer 6. The second end of the n type barrier layer 15 is located on a bottom of the channel p well layer 6.

In the lateral IGBT, when a predetermined gate voltage is applied to the gate electrode 11, the channel region is provided at the surface portion of the channel p well layer 6 located under the gate electrode 11 disposed between the n+ type emitter region 7 and the n type barrier layer 15, electrons flow from the emitter electrode 13 and the n+ type emitter region 7 to the n− type drift layer 2 through the channel region. Accordingly, holes flows to the n− type drift layer 2 through the collector electrode 12 and the collector region 4, and conductivity modulation occurs in the n− type drift layer 2. Thereby, high current flows between the emitter and the collector in the lateral IGBT.

In the lateral IGBT, the n type barrier layer 15 is disposed adjacent to the emitter. The n type barrier layer 15 can function as barrier of holes. The n type barrier layer 15 restricts that holes injected from the collector flow to the channel p well layer 6 adjacent to the emitter and a hole concentration decreases. Thus, a carrier concentration of the n− type drift layer 2 in the vicinity of the emitter can be increased, and an on-voltage can be reduced.

In the present embodiment, the second end of the n type barrier layer 15 is located on the bottom of the channel p well layer 6. Thus, the n type barrier layer 15 is not disposed between the adjacent emitters, that is, between the adjacent channel p well layers 6. As shown in FIG. 2, a plurality of cells is arranged so as to configurate the lateral IGBT. In adjacent cells, the n+ type emitter regions 7 and the channel p well layers 6 are arranged in parallel, and the channel p well layer 6 in one cell is disposed at a predetermined distance from the channel p well layer 6 in adjacent cell. The n type barrier layer 15 is not disposed between the channel p well layers 6. Thus, a portion between the channel p well layers 6 does not function as a barrier of holes, and a hole concentration is reduced. Thus, accumulation of excessive holes can be restricted, and a high-speed turning off can be achieved.

Figure 4:
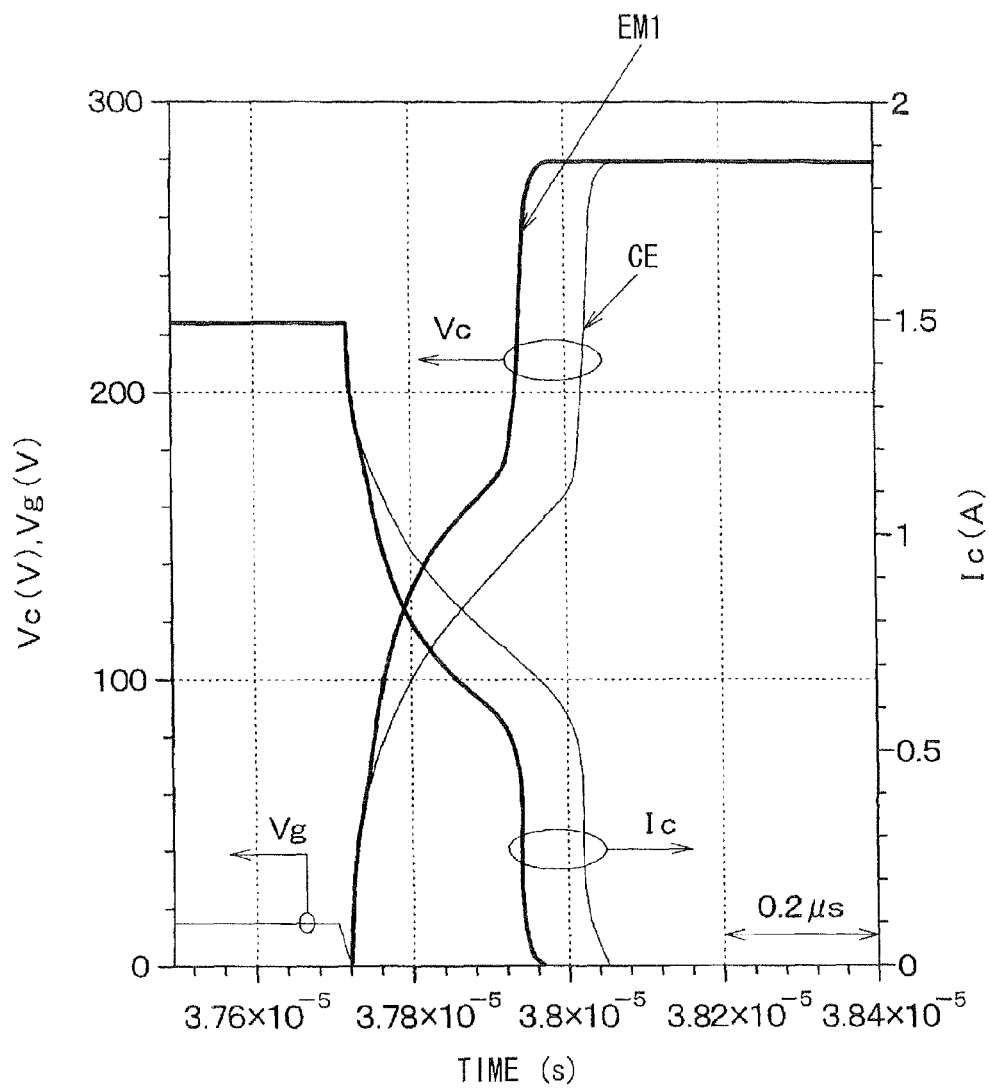
FIG. 4 is a diagram showing changes in collector current Ic and collector voltage Vc in the semiconductor device according to the first embodiment (EM1) and a semiconductor device according to a comparative example (CE) when application of a predetermined gate voltage Vg is turned off.

FIG. 4 is a diagram showing changes in collector current Ic and collector voltage Vc in the semiconductor device according to the first embodiment (EM1) and a semiconductor device according to a comparative example (CE) when application of a predetermined gate voltage Vg is turned off. In the semiconductor device according to the comparative example, the n type barrier layer 15 is disposed also between adjacent emitters.

As shown in FIG. 4, a turning-off time of the semiconductor device according to the present embodiment is shorter than a turning-off time of the semiconductor device according to the comparative example. This is because, in the semiconductor device according to the present embodiment, the n type barrier layer 15 is not disposed between the emitters, holes easily flow to the portion between the emitters, and the amount of holes that flows from the collector to the emitter through surface portions of the n type barrier layer 15 and the channel p well layer 6 located just under the gate insulating layer 10 is reduced. Thus, a parasitic npn transistor provided by the n+ type emitter region 7, the channel p well layer 6, and the n type barrier layer 15 (or the n− type drift layer 2) has difficulty operating and the turning-off time is improved. Furthermore, because the carrier concentration in the vicinity of the emitter is maintained moderately low, a dynamic avalanche at switching can be restricted, and a reduction of a dynamic breakdown voltage can be restricted. As a result, the turning-off time is improved.

As described above, in the semiconductor device including the lateral IGBT according to the present embodiment, the on-voltage can be reduced with increasing the carrier concentration in the vicinity of the emitter by forming the n type barrier layer 15. In addition, because the n type barrier layer 15 is not formed between the adjacent emitters, the turning-off time can be improved. Furthermore, a breakdown endurance at switching can be improved. Thus, in the lateral IGBT according to the present embodiment, the on-voltage can be reduced, the breakdown endurance can be secured, and the switching speed can be increased at the same time.

As described above, the buried oxide layer 1b in the SOI substrate 1 can have any thickness and the active layer 1c (n− type drift layer 2) can have any thickness and any impurity concentration. By controlling the thicknesses and the impurity concentration, the lateral IGBT can have a breakdown voltage of greater than or equal to 600 V.

Figure 5:
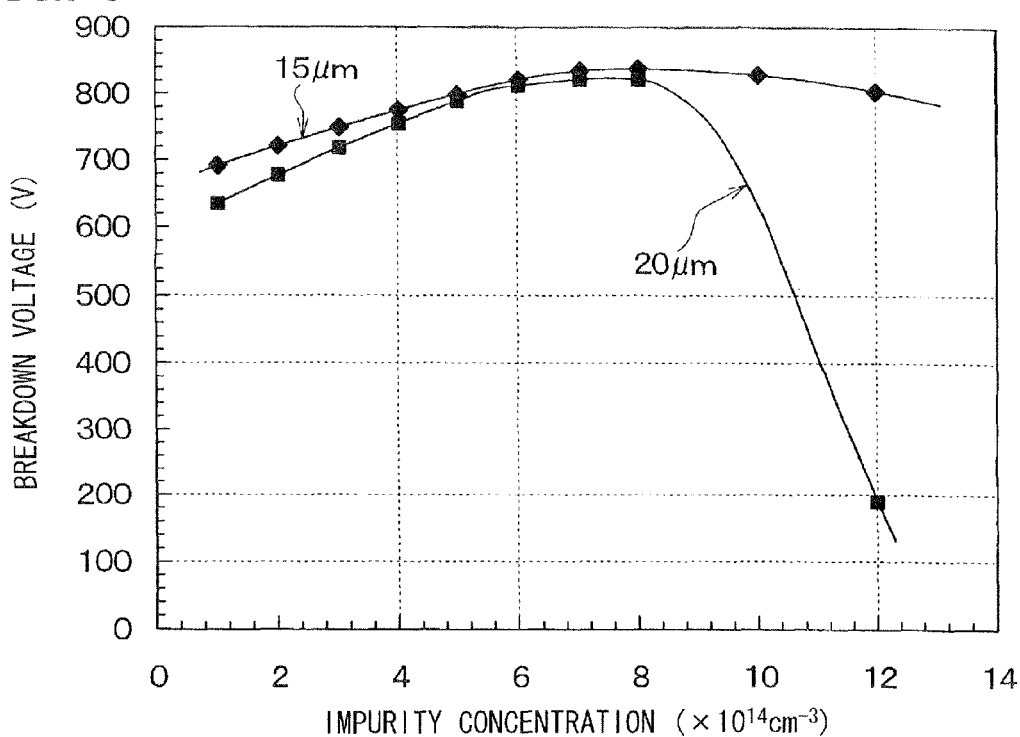
FIG. 5 is a graph showing a simulation result of a thickness of an n− type drift layer and a breakdown voltage when an n type impurity concentration of the n− type drift layer is changed.

FIG. 5 is a diagram showing a simulation result of a relationship between the thickness of the n− type drift layer 2 and the breakdown voltage when the n type impurity concentration of the n− type drift layer 2 is changed. As shown in FIG. 5, in a case where the n− type drift layer 2 has a thickness of 15 μm, the breakdown voltage is greater than or equal to 600 V when the n type impurity concentration is at least within a range from $1 \times 10^{14}$ cm$^{-3}$ to $1.2 \times 10^{15}$ cm$^{-3}$. In a case where the n− type drift layer 2 has a thickness of less than 15 μm, similar result is available. In a case where the n− type drift layer 2 has a thickness of 20 μm, the breakdown voltage is greater than or equal to 600 V when the n type impurity concentration is at least within a range from $1 \times 10^{14}$ cm$^{-3}$ to $8 \times 10^{14}$ cm$^{-3}$.

Thus, in order to secure the breakdown voltage of greater than or equal to 600 V stably, it is preferred that the n type impurity concentration of the n− type drift layer 2 is set to be within a range from $1 \times 10^{14}$ cm$^{-3}$ to $1.2 \times 10^{15}$ cm$^{-3}$ in a case where the thickness is less than or equal to 15 μm, and it is preferred that the n type impurity concentration of the n− type drift layer 2 is set to be within a range from $1 \times 10^{14}$ cm$^{-3}$ to $1.2 \times 10^{15}$ cm$^{-3}$ in a case where the thickness is 20 μm.

Figure 6:
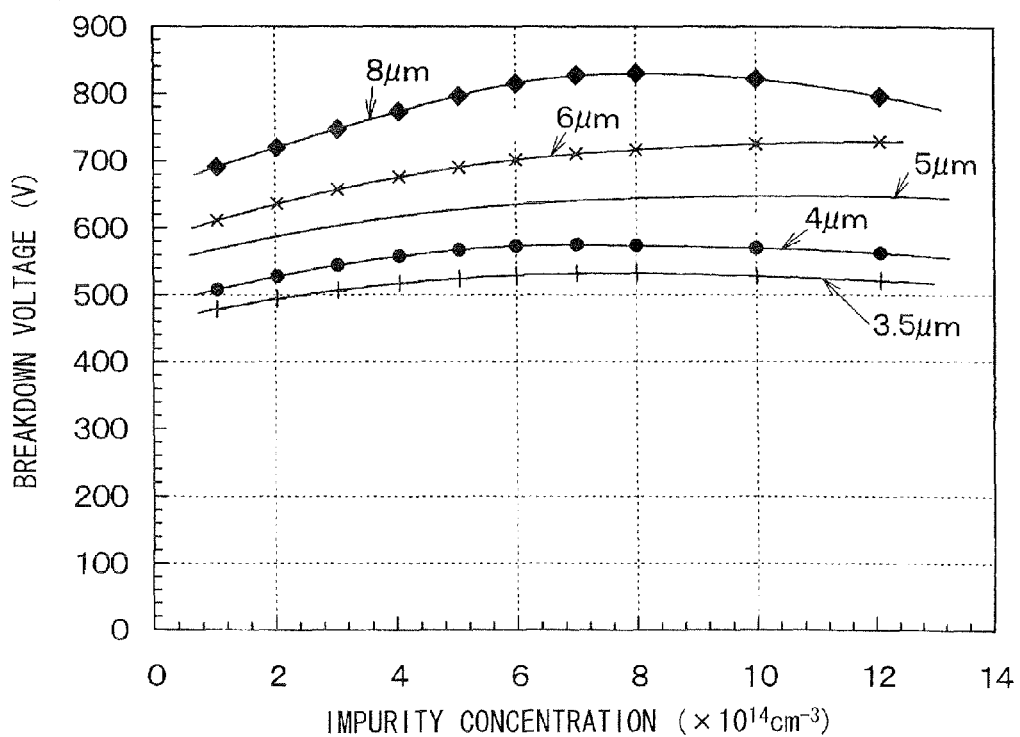
FIG. 6 is a graph showing a simulation result of a thickness of a buried oxide layer and a breakdown voltage when a thickness of an n− type drift layer is fixed at 15 μm and an n type impurity concentration of the n− type drift layer is changed.

FIG. 6 is a diagram showing a simulation result of a relationship between the thickness of the buried oxide layer 1b and the breakdown voltage when the thickness of the n− type drift layer 2 is fixed at 15 μm and the n type impurity concentration of the n− type drift layer 2 is changed. As shown in FIG. 6, in a case where the buried oxide layer 1b has a thickness of greater than or equal to 4 μm, a breakdown voltage is close to 600 V. In a case where the buried oxide layer 1b has a thickness of greater than or equal to 5 μm, a breakdown voltage is greater than or equal to 600 V even when the n type impurity concentration is changed.

Thus, it is preferred that the thickness of the buried oxide layer 1b is greater than or equal to 4 μm. In order to secure a breakdown voltage of greater than or equal to 600 V stably, it is preferred that the thickness of the buried oxide layer 1b is greater than or equal to 5 μm.

Second Embodiment

A semiconductor device including a lateral IGBT according to a second embodiment of the present invention will be described with reference to FIG. 7.

Figure 7:
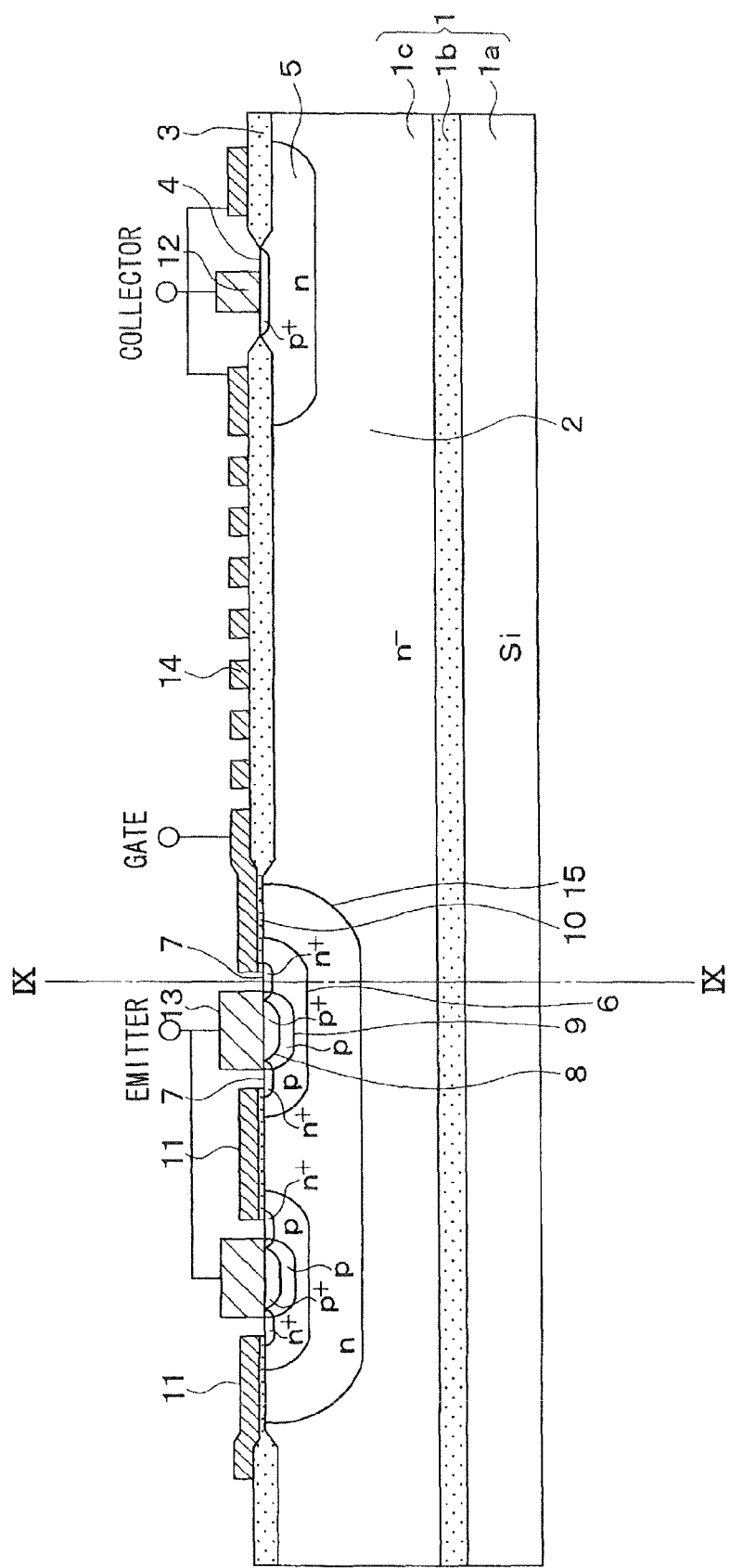
FIG. 7 is a cross-sectional view of a semiconductor device that includes a lateral IGBT according to a second embodiment of the present invention.

As shown in FIG. 7, in the present embodiment, the n type barrier layer 15 is disposed also between adjacent emitters, that is, between adjacent channel p well layers 6. If the n type barrier layer 15 has an impurity concentration same as the first embodiment, the structure of the lateral IGBT is similar to a structure of a lateral IGBT according to the prior art and the turning-off time increases. Thus, in the present embodiment, an n type impurity peak concentration of the n type barrier layer 15 is set to be within a range from $2 \times 10^{15}$ cm$^{-3}$ to $1.5 \times 10^{16}$ cm$^{-3}$.

Figure 8:
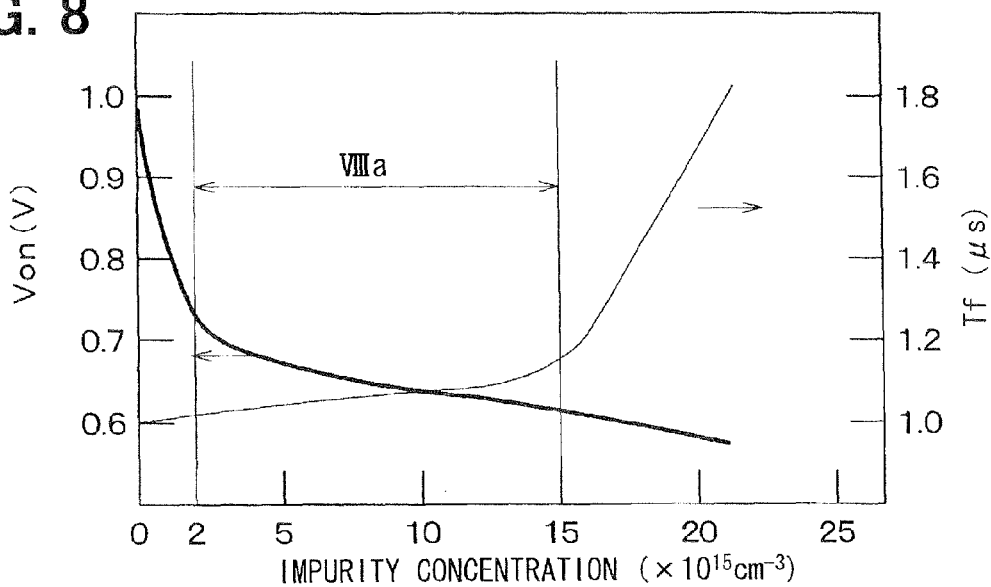
FIG. 8 is a graph showing a relationship between an n type impurity peak concentration of an n type barrier layer and an on-voltage and a relationship between the n type impurity peak concentration and a falling time.

FIG. 8 is a graph showing a relationship between the n type impurity peak concentration of the n type barrier layer 15 and an on-voltage (Von) of the lateral IGBT and a relationship between the impurity concentration of the n type barrier layer 15 and a switching time (falling time) Tf. The lateral IGBT can have a stable on-voltage when the n type impurity peak concentration of the n type barrier layer 15 is greater than or equal to $2 \times 10^{15}$ cm$^{-3}$. The reason of the above-described result can be thought that when the n type impurity concentration of n type barrier layer 15 is a few times as high as the n type impurity concentration of the n− type drift layer 2, the n type barrier layer 15 sufficiently functions as a barrier and the on-voltage is reduced. In addition, the lateral IGBT can have a stable short falling time when the n type impurity peak concentration of the n type barrier layer 15 is less than or equal to $1.5 \times 10^{16}$ cm$^{-3}$. The reason of the above-described result can be thought that when the impurity concentration of the n type barrier layer 15 is too high, a local dynamic avalanche occurs.

Thus, when the n type impurity peak concentration of the n type barrier layer 15 is within a range from $2 \times 10^{15}$ cm$^{-3}$ to $1.5 \times 10^{16}$ cm$^{-3}$ as indicated by a region VIIIa in FIG. 8, the n type barrier layer 15 can sufficiently function as a barrier and the on-voltage can be reduced, and reduction of a dynamic breakdown voltage can be restricted by maintaining the carrier concentration in the vicinity of the emitter at a moderately low value.

Figure 9:
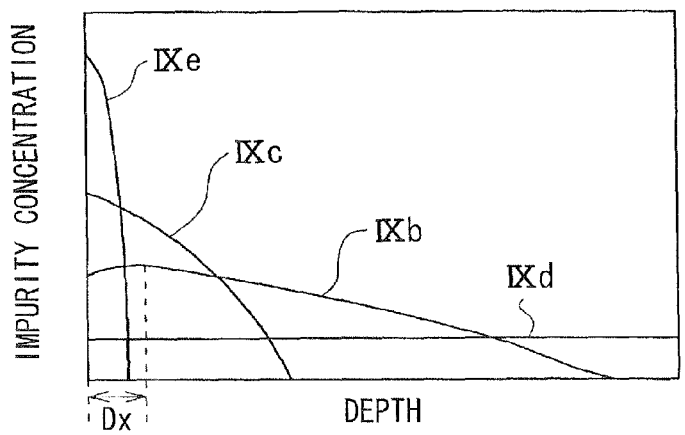
FIG. 9 is a graph showing impurity concentration distribution of an n+ type emitter region (IXe), a channel p well layer (IXc), an n type barrier layer (IXb), and an n type drift layer (IXd) from a surface of a substrate.

The n type barrier layer 15 includes a peak portion that has the n type impurity peak concentration, and the peak portion is located at a depth of less than or equal to 0.5 μm from a surface of the substrate, that is, a surface of the n type barrier layer 15. FIG. 9 is a graph showing impurity concentration distribution of the n+ type emitter region 7 (IXe), the channel p well layer 6 (IXc), the n type barrier layer 15 (IXb), and the n− type drift layer 2 (IXd) from the surface of the substrate. A horizontal axis of FIG. 9 shows the depth from the surface of the substrate along a line IX-IX in FIG. 7. Although the n type barrier layer 15 is disposed from the surface of the substrate to a position deeper than the channel p well layer 6, the peak portion of the n type barrier layer 15 is located at a position shallower than the deepest portion of the channel p well layer 6.

Figure 10:
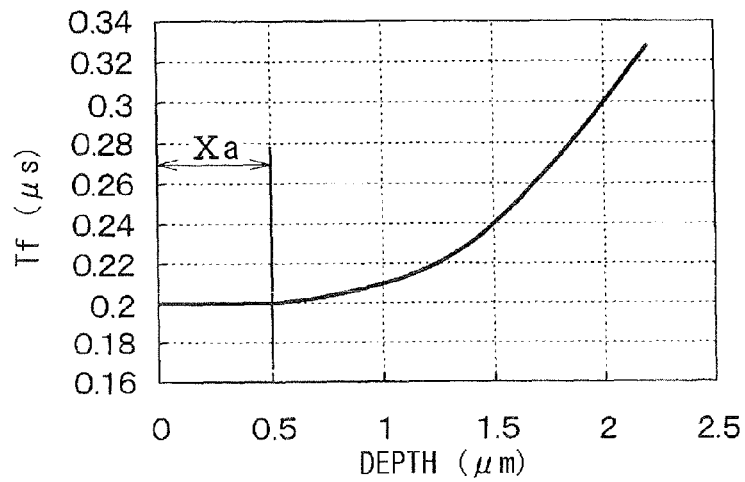
FIG. 10 is a graph showing a relationship between a depth of a peak portion of the n type barrier layer from the surface of the substrate and a falling time Tf.

FIG. 10 is a graph showing a relationship between the depth of the peak portion of the n type barrier layer 15 from the surface of the substrate and the falling time Tf. The falling time Tf is fixed at 0.2 μs when the depth of the peak portion of the n type barrier layer 15 from the surface of the substrate is less than or equal to 0.5 μm as indicated by a region Xa, and the falling time Tf gradually increases when the depth of the peak portion is greater than 0.5 μm Thus, in the lateral IGBT according to the present embodiment, an increase in the falling time Tf is restricted by disposing the peak portion of the n type barrier layer 15 at a depth of less than or equal to 0.5 μm from the surface of the substrate. Accordingly, hole current does not flow in the channel p well layer 6 under the n+ type emitter region 7 and the parasitic npn transistor does not operate.

As described above, in the lateral IGBT according to the present embodiment, the n type barrier layer 15 is disposed also between the adjacent emitters, that is, between the adjacent channel p well layers 6, and the n type barrier layer 15 has the n type impurity peak concentration of from $2 \times 10^{15}$ cm$^{-3}$ to $1.5 \times 10^{16}$ cm$^{-3}$. Also in the present case, effects similar to the effects of the first embodiment can be achieved. In addition, by disposing the peak portion of the n type barrier layer 15 at the depth of less than or equal to 0.5 μm, a high-speed switching can be achieved.

Third Embodiment

A semiconductor device including a lateral IGBT according to a third embodiment of the present invention will be described with reference to FIG. 11.

Figure 11:
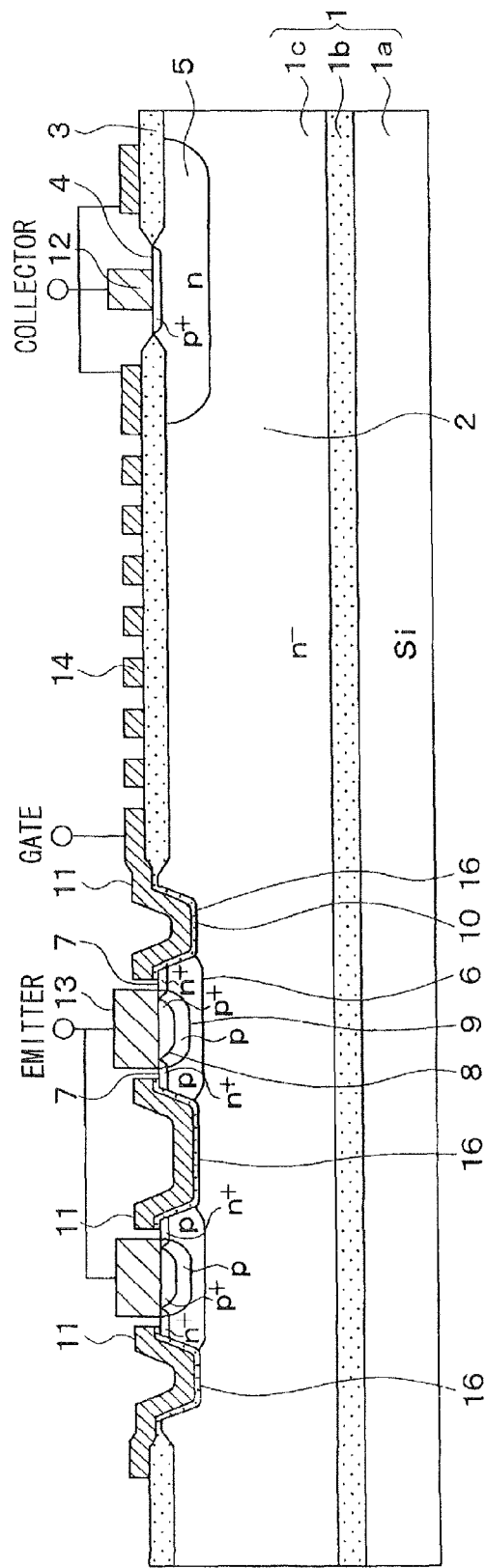
FIG. 11 is a cross-sectional view of a semiconductor device including a lateral IGBT according to a third embodiment of the present invention.

As shown in FIG. 11, the lateral IGBT according to the present embodiment has a trench gate structure. A trench 16 is provided from an end of the emitter region 7 adjacent to a channel region, and a gate insulating layer 10 and a gate electrode 11 are disposed in the trench 16. The trench 16 is provided at least between the n+ type emitter region 7 and the LOCOS oxide layer 3 and between adjacent n+ type emitter regions 7. In the present embodiment, the trench 16 surrounds the whole outer periphery of the collector region 4. The trench 16 has a depth of, for example, from 0.5 μm to 3 μm. A corner portion of a bottom of the trench 16 has a radius of curvature of greater than or equal to 0.5 μm by a rounding process such as heat treating.

Accordingly, the channel region is provided at a portion of the channel p well layer 6 located on a sidewall of the trench 16. Because the trench 16 is provided, holes are restricted from extracting toward the channel p well layer 6 using a passage to the surface of the substrate as a main path. Thus, a hole concentration of the n− type drift layer 2 can be increased, a carrier concentration of the n− type drift layer 2 in the vicinity of the emitter can be increased, and the on-voltage can be reduced.

Furthermore, because the corner portion of the bottom of the trench 16 has the radius of curvature of greater than or equal to 0.5 μm, electric field concentration at the bottom of the trench 16 can be restricted, and an increase in a switching time (falling time) can be restricted.

Modifications of Third Embodiment

The n type barrier layer 15 may be provided in the lateral IGBT according to the third embodiment.

Figure 12:
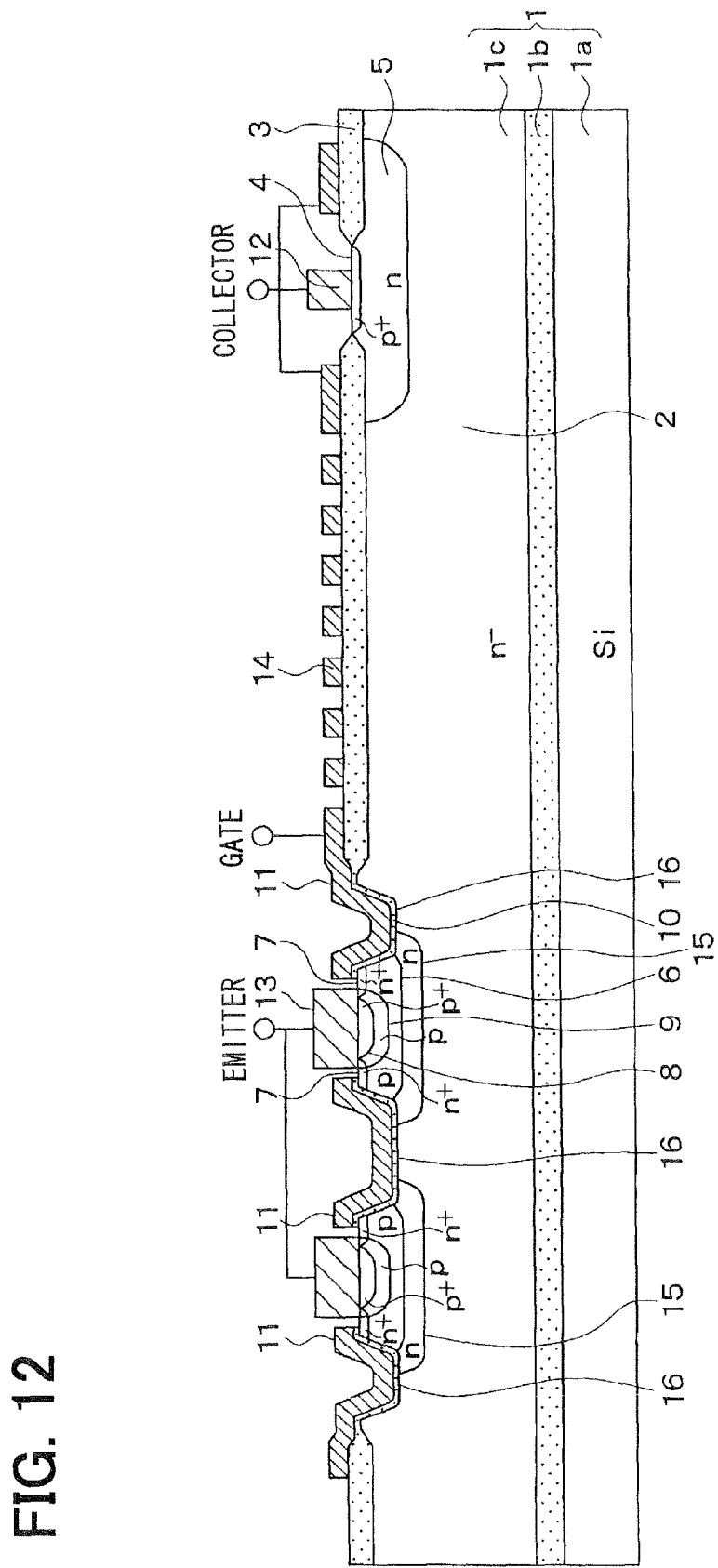
FIG. 12 is a cross-sectional view of a semiconductor device including a lateral IGBT according to a modification of the third embodiment.
Figure 13:
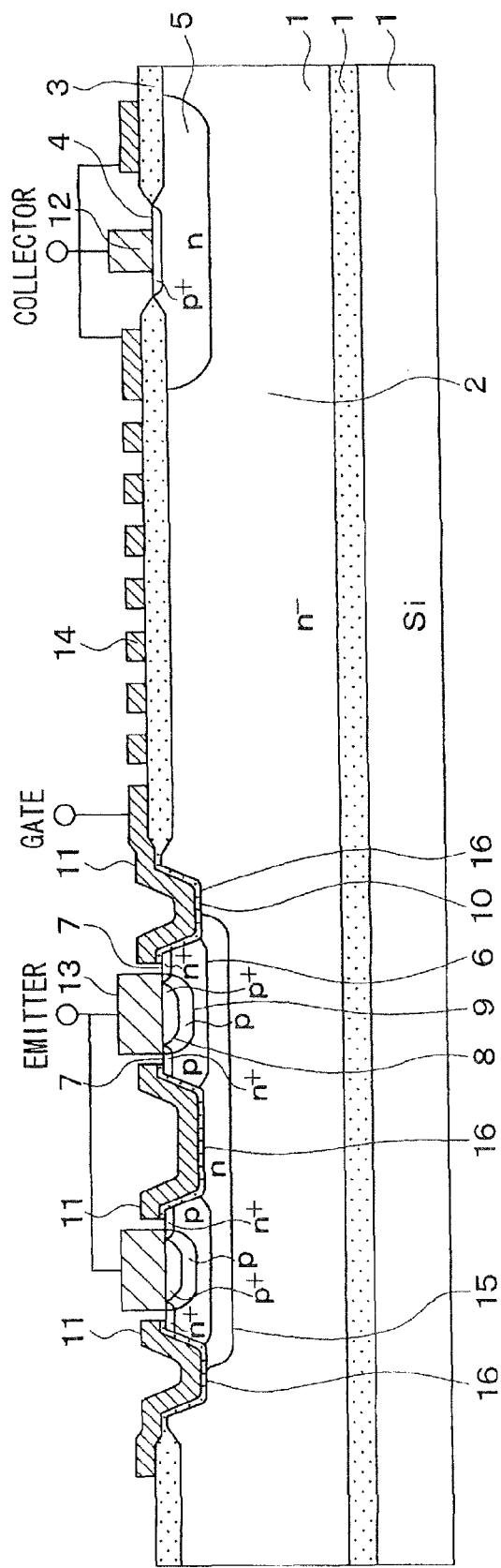
FIG. 13 is a cross-sectional view of a semiconductor device including a lateral IGBT according to another modification of the third embodiment.

For example, as shown in FIG. 12, the n type barrier layer 15 may be disposed to a depth deeper than the channel p well layer 6 so as to cover the channel p well layer 6, that is, to couple adjacent trenches 16. As shown in FIG. 13, the n type barrier layer 15 may also be formed so as to extend across the trench 16 located between adjacent cells, that is, to cover the two channel p well layers 6 in the adjacent cells.

By combining the trench 16 and the n type barrier layer 15, the n type barrier layer 15 can function as a barrier of holes, the carrier concentration of the n− type drift layer 2 in the vicinity of the emitter can be further increased, and the on-voltage can be further reduced. Furthermore, because a parasitic npn transistor provided in the vicinity of the emitter does not operate, an increase in the switching time can be restricted.

Fourth Embodiment

A semiconductor device including a lateral IGBT according to a fourth embodiment of the present invention will be described with reference to FIG. 14. Although the diagram in FIG. 14 is not a cross-sectional view, the n type barrier layer 15 is illustrated with hatching so as to facilitate visualization.

Figure 14:
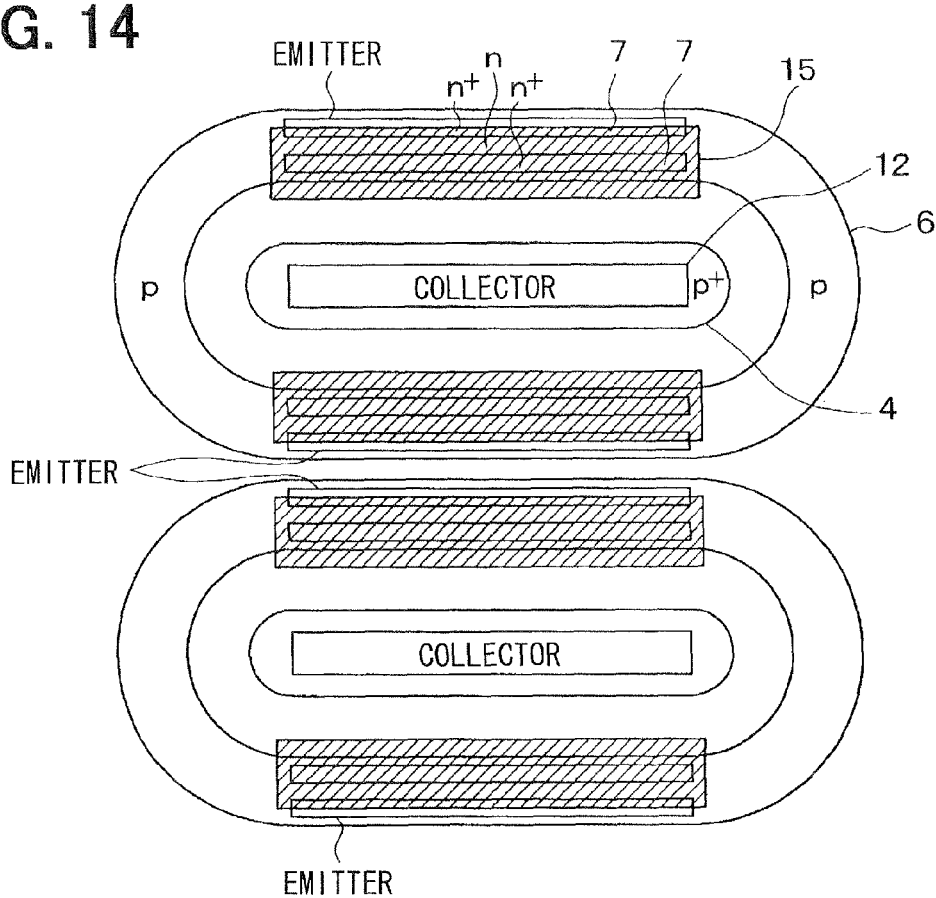
FIG. 14 is a diagram showing a top layout of components included in the lateral IGBT according to a fourth embodiment of the present invention.

As shown in FIG. 14, the n+ type emitter region 7 is disposed along either side of the collector region 4, and the channel p well layer 6 is disposed around the collector region 4. The n type barrier layer 15 is disposed along either side of the collector region 4, that is, only at a linear portion, and the n type barrier layer 15 is not disposed at a corner portion around either longitudinal ends of the collector region 4.

Figure 15:
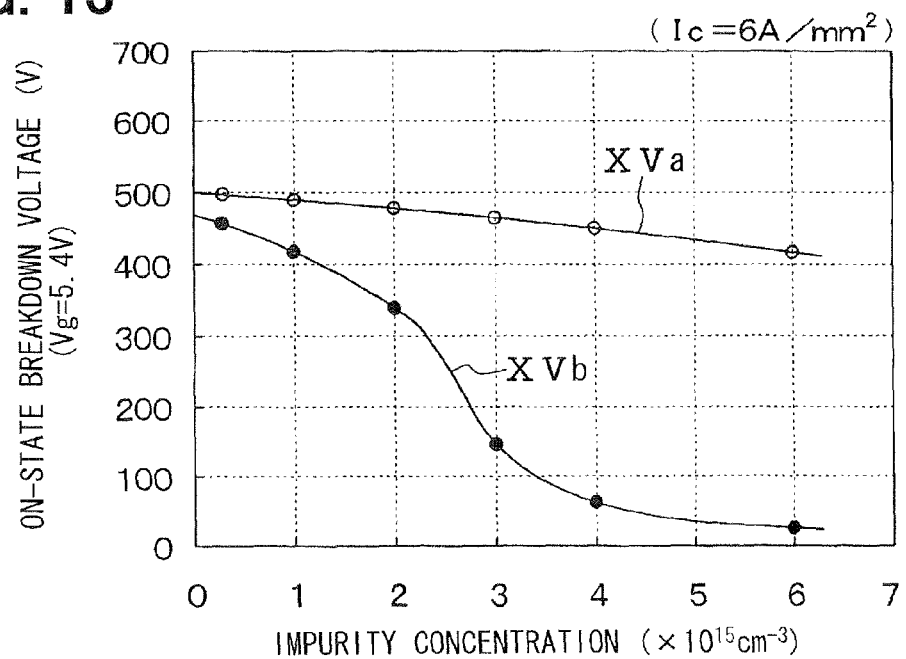
FIG. 15 is a graph showing a simulation result of a relationship between an n type impurity concentration of an n type barrier layer and an on-state breakdown voltage at a linear portion (XVa) and a corner portion (XVb)

FIG. 15 is a graph showing a simulation result of a relationship between the n type impurity concentration of the n type barrier layer 15 and the on-state breakdown voltage at the linear portion (XVa) and the corner portion (XVb). As shown in FIG. 15, the on-voltage does not drastically change at the linear portion of the n type barrier layer 15 even when the n type impurity concentration is increased. However, the on-voltage drastically decreases at the corner portion of the n type barrier layer 15 when the n type impurity concentration is increased.

Thus, a decrease in the on-state breakdown voltage can be restricted by not disposing the n type barrier layer 15 at the corner portion around either longitudinal ends of the collector region 4.

Modifications of Fifth Embodiment

Figure 16:
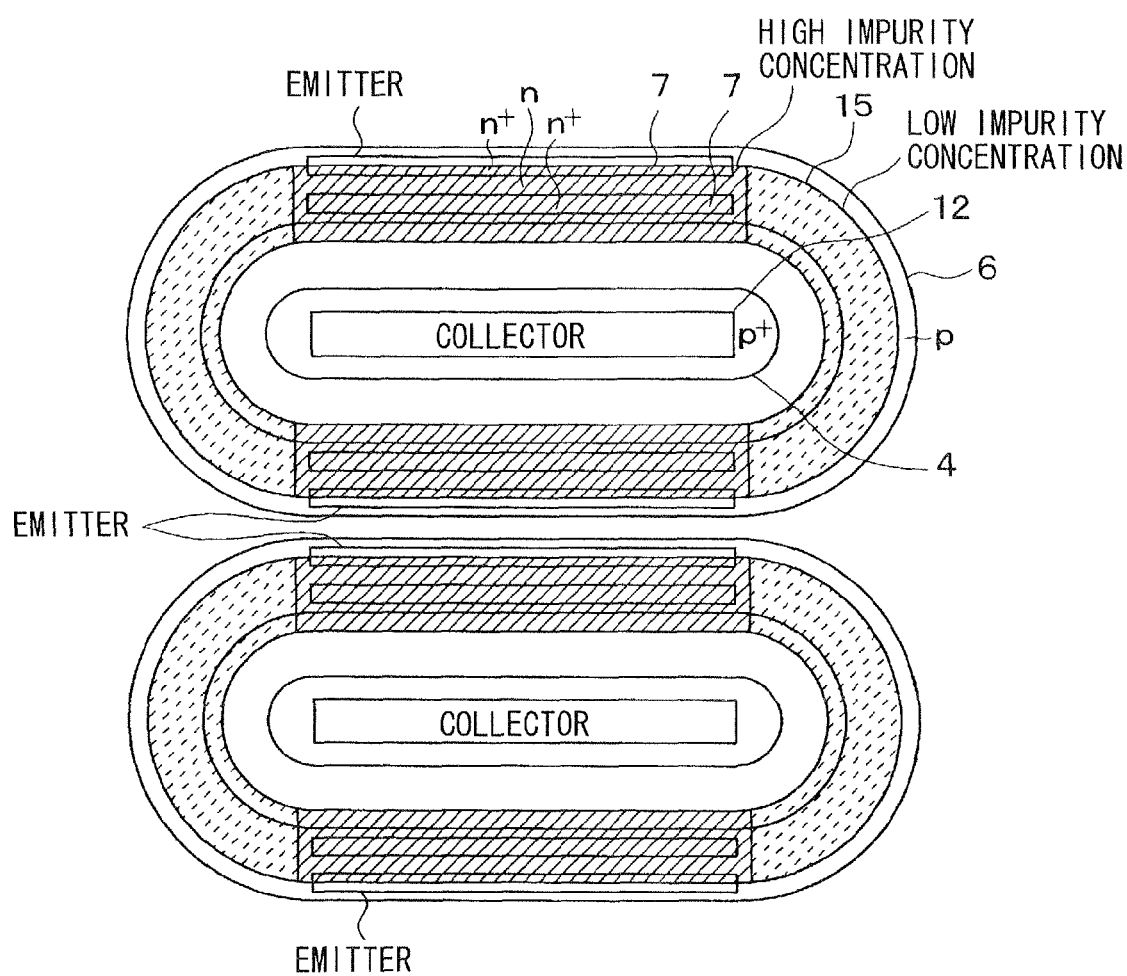
FIG. 16 is a diagram showing a top layout of components included in a lateral IGBT according to a modification of the fourth embodiment.

In the lateral IGBT according to the fourth embodiment, the n type barrier layer 15 is not disposed at the corner portion around either longitudinal ends of the n type barrier layer 15. The n type barrier layer 15 may also be disposed at the corner portion in a condition that the n type impurity concentration at the corner portion is lower than the n type impurity concentration at the linear portion. FIG. 16 is a diagram showing a top layout of components included in a lateral IGBT according to a modification of the fourth embodiment. Although the diagram in FIG. 16 is not a cross-sectional view, the n type barrier layer 15 is illustrated with hatching so as to facilitate visualization.

Although the top layout of the n type barrier layer 15 is similar to the first embodiment, the n type impurity concentration of the linear portion of the n type barrier layer 15 is increased, and the corner portion of the n type barrier layer 15 has an n type impurity concentration lower than the linear portion and higher than the n− type drift layer 2. In the present modification, the corner portion of the n type barrier layer 15 has the n type impurity concentration of less than or equal to $2 \times 10^{15}$ cm$^{-3}$. Thus, the n type impurity concentration of the corner portion of the n type barrier layer 15 can be determined so that the on-state breakdown voltage does not drastically decrease.

Also in the lateral IGBT according to the second embodiment, the n type barrier layer 15 may be not provided at the corner portion, or the n type impurity concentration of the corner portion may be lower than the n type impurity concentration of the linear portion.

Fifth Embodiment

Figure 17A:
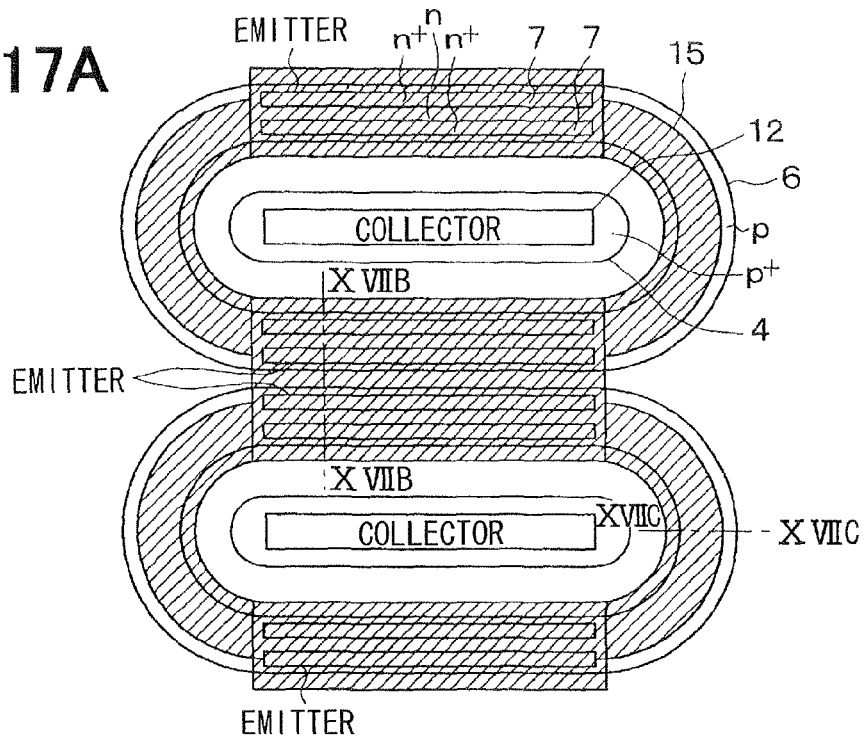
FIG. 17A is a diagram showing a top layout of components in a semiconductor device that includes a lateral IGBT according to a fifth embodiment of the present invention.
Figure 17B:
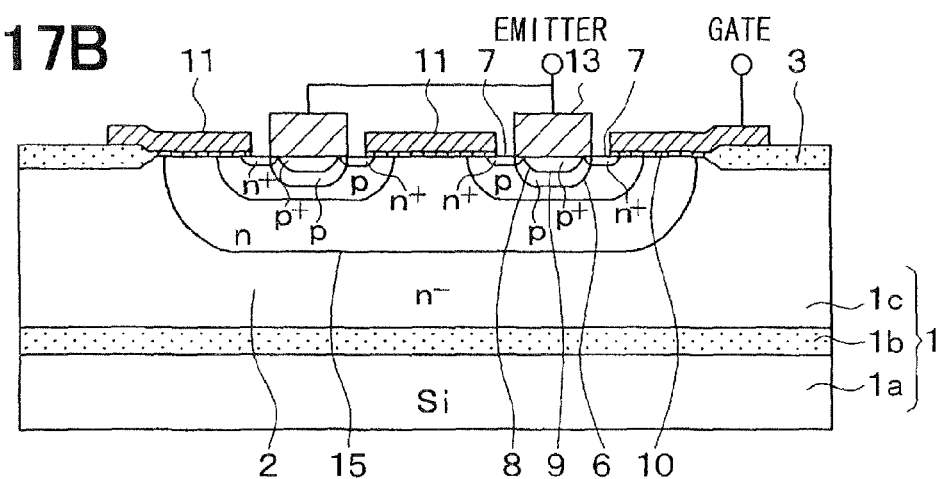
FIG. 17B is a cross-sectional view of the semiconductor device taken along line XVIIB-XVIIB in FIG. 17A.
Figure 17C:
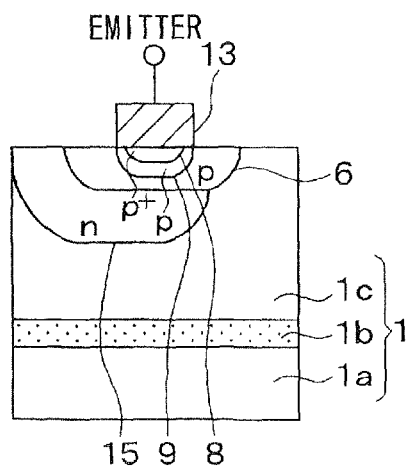
FIG. 17C is a cross-sectional view of the semiconductor device taken along line XVIIC-XVIIC in FIG. 17A.

A semiconductor device including a lateral IGBT according to a fifth embodiment will be described with reference to FIG. 17A to FIG. 17C.

The n type barrier layer 15 is provided also in the present embodiment. In the linear portion, the n type barrier layer 15 is disposed also as between adjacent emitters as shown in FIG. 17B in a manner similar to the second embodiment. In the corner portion, the first end of the n type barrier layer 15 is located between the channel p well layer 6 and the collector region 4, and the second end of the n type barrier layer 15 is located on the bottom of the channel p well layer 6 as shown in FIG. 17C in a manner similar to the first embodiment.

Figure 18:
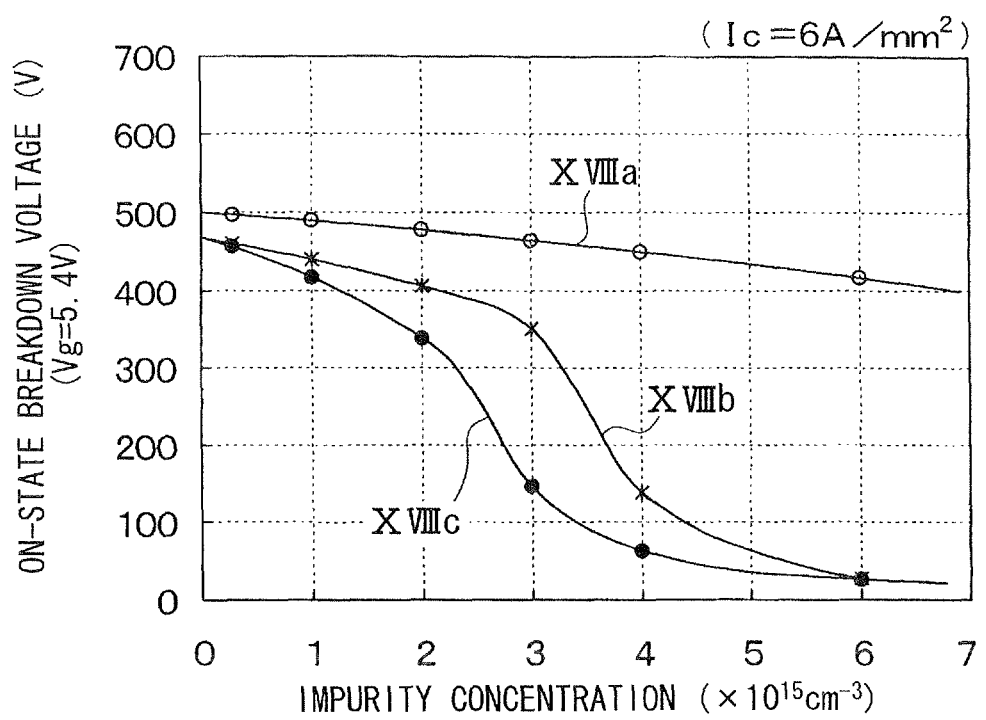
FIG. 18 is a graph showing a relationship between an n type impurity concentration of an n type barrier layer and an on-state breakdown voltage in each of a case (XVIIIA) where a linear portion has a structure similar to the second embodiment, a case (XVIIIB) where a corner portion has a structure similar to the first embodiment, and a case (XVIIIC) where a corner portion has a structure similar to the second embodiment.

FIG. 18 is a graph showing a relationship between the n type impurity concentration of the n type barrier layer 15 and the on-state breakdown voltage in each of a case (XVIIIA) where the linear portion has a structure similar to the second embodiment, a case (XVIIIB) where the corner portion has a structure similar to the first embodiment, and a case (XVIIIC) where the corner portion has a structure similar to the second embodiment. As shown in FIG. 18, in the case where the corner portion of the n type barrier layer 15 has the structure similar to the first embodiment, a decrease in the on-state breakdown voltage can be restricted compared with the case where the corner portion has the structure similar to the second embodiment. In particular, when the corner portion of the n type barrier layer 15 has an n type impurity concentration of $3 \times 10^{15}$ cm$^{-3}$, the decrease in the on-state voltage can restricted efficiently, and the lateral IGBT can have a high on-state breakdown voltage.

As described above, by combining the linear portion of the n type barrier layer 15 having the structure similar to the second embodiment and the corner portion of the n type barrier layer 15 having the structure similar to the first embodiment, the lateral IGBT according to the present embodiment can reduce the on-voltage, can secure the breakdown endurance, and can reduce the switching speed at the same time.

Sixth Embodiment

A semiconductor device including a lateral IGBT according to a sixth embodiment of the present invention will be described with reference to FIG. 19 to FIG. 21.

Figure 19:
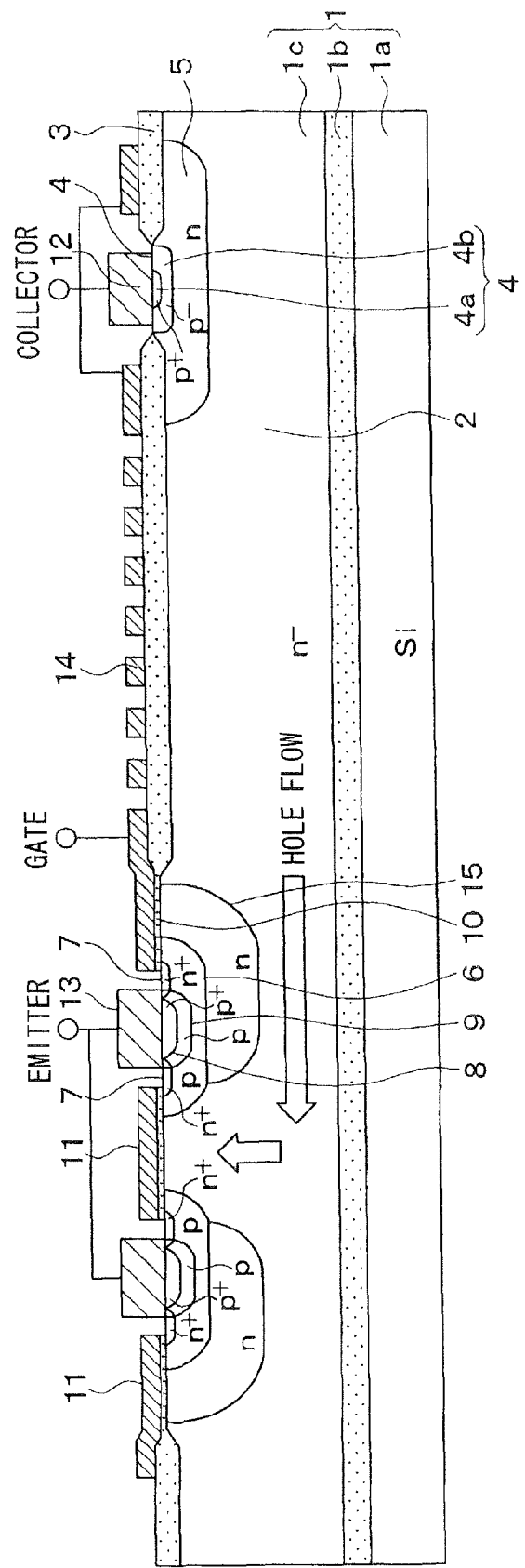
FIG. 19 is a cross-sectional view of a semiconductor device that includes a lateral IGBT according to a sixth embodiment of the present invention.
Figure 20:
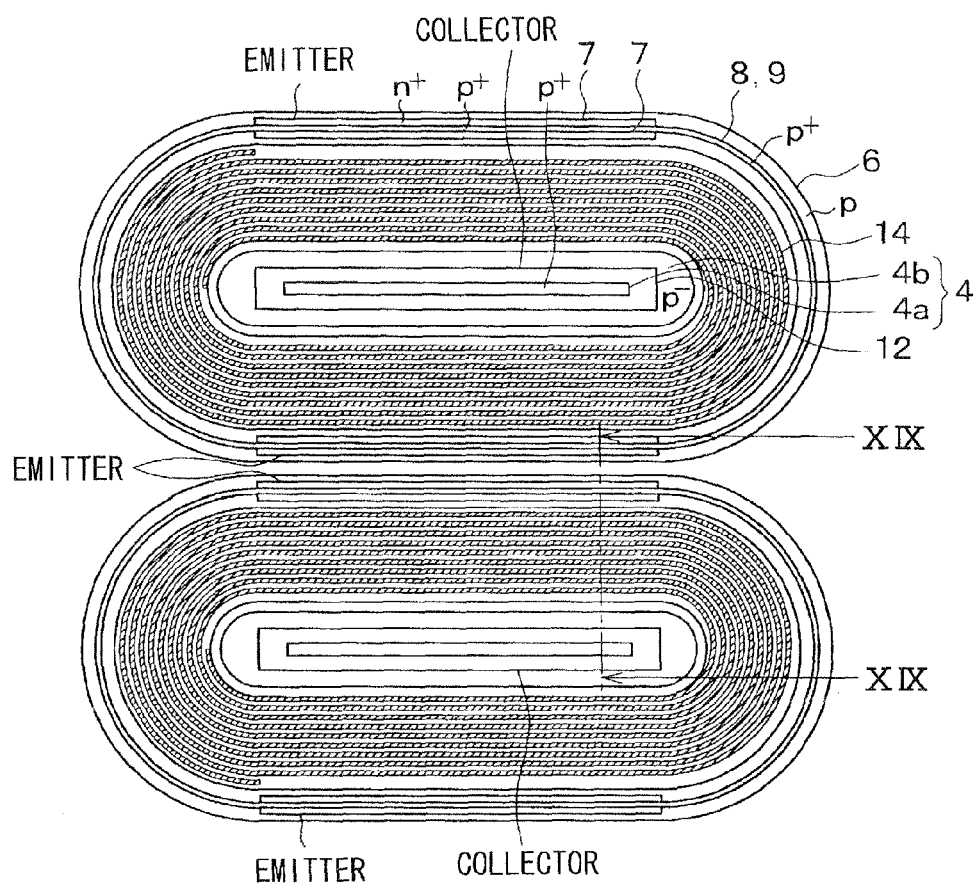
FIG. 20 is a diagram showing a top layout the semiconductor device shown in FIG. 19.

FIG. 19 corresponds to a cross-sectional view of the semiconductor device taken along line XIX-XIX in FIG. 20. In FIG. 21, a portion with a hatched pattern is a contact portion where the collector region 4 is in contact with the collector electrode 12.

In the lateral IGBT according to the present embodiment, the collector region 4 includes a p+ type region 4a and a p− type region 4b that has an impurity concentration lower than the p+ type region 4a. On a surface of the collector region 4, the p+ type region 4a and the p− type region 4b are exposed from the LOCOS oxide layer 3 and the p+ type region 4a and the p− type region 4b can function as the contact portion with the collector electrode 12. The collector electrode 12 forms an ohmic junction with the p+ type region 4a, and the collector electrode 12 forms a schottky junction with the p− type region 4b. An interface of the collector electrode 12 being in contact with the p+ type region 4a may be made of a barrier metal that can form a schottky junction. The barrier metal that can form a schottky junction with p type silicon having a high impurity concentration includes, for example, Ti, TiN, and Ni.

For example, the p+ type region 4a has a surface impurity concentration of from $1 \times 10^{19}$ cm$^{-3}$ to $1 \times 10^{20}$ cm$^{-3}$ and has a depth of 0.6 μm, and the p− type region 4b has a surface impurity concentration of from $1 \times 10^{16}$ cm$^{-3}$ to $1 \times 10^{19}$ cm$^{-3}$ or from $1 \times 10^{15}$ cm$^{-3}$ to $1 \times 10^{15}$ cm$^{-3}$ and has a depth of 2 μm. In the present embodiment, the p+ type region 4a and the p− type region 4b extend along the longitudinal direction of the collector region 4, and the p+ type region 4a is surrounded by the p− type region 4b.

The p+ type region 4a and the p− type region 4b are further surrounded by the n type buffer layer 5. In the present embodiment, the n type buffer layer 5 can function as a field stop layer and can restrict expansion of a depletion layer.

Thus, a steady loss can be restricted. For example, the n type buffer layer 5 has an impurity concentration of from $4 \times 10^{16}$ cm$^{-3}$ to $1 \times 10^{15}$ cm$^{-3}$.

As described above, in the lateral IGBT according to the present embodiment, the collector electrode 12 forms the ohmic junction with the p+ type region 4a and the collector electrode 12 forms the schottky junction with the p-type region 4b. Thus, an injection of holes from the collector can be restricted, and the switching time can be reduced without controlling a lifetime. Because the injection of holes can be restricted by the above-described junctions of the collector electrode 12 and the collector region 4, the n type buffer layer 5 does not need to restrict the injection of holes, and the n type buffer layer 5 needs only to function as the field stop layer. Thus, the impurity concentration of the n type buffer layer 5 can be set to a low impurity concentration without changing an injection efficiency in the vicinity of the collector.

The lateral IGBT according to the present embodiment can restrict the injection of holes in the vicinity of the collector. In addition, in the vicinity of the emitter, the lateral IGBT can restrict that holes injected by the n type barrier layer 15 flows to the channel p well layer 6 in the vicinity of the emitter and thereby the hole concentration is reduced. Thus, the hole concentration can be uniformly maintained at a high value from the collector to the emitter, the on-voltage can be reduced, and the switching time can be reduced.

Modifications of Sixth Embodiment

Figure 22:
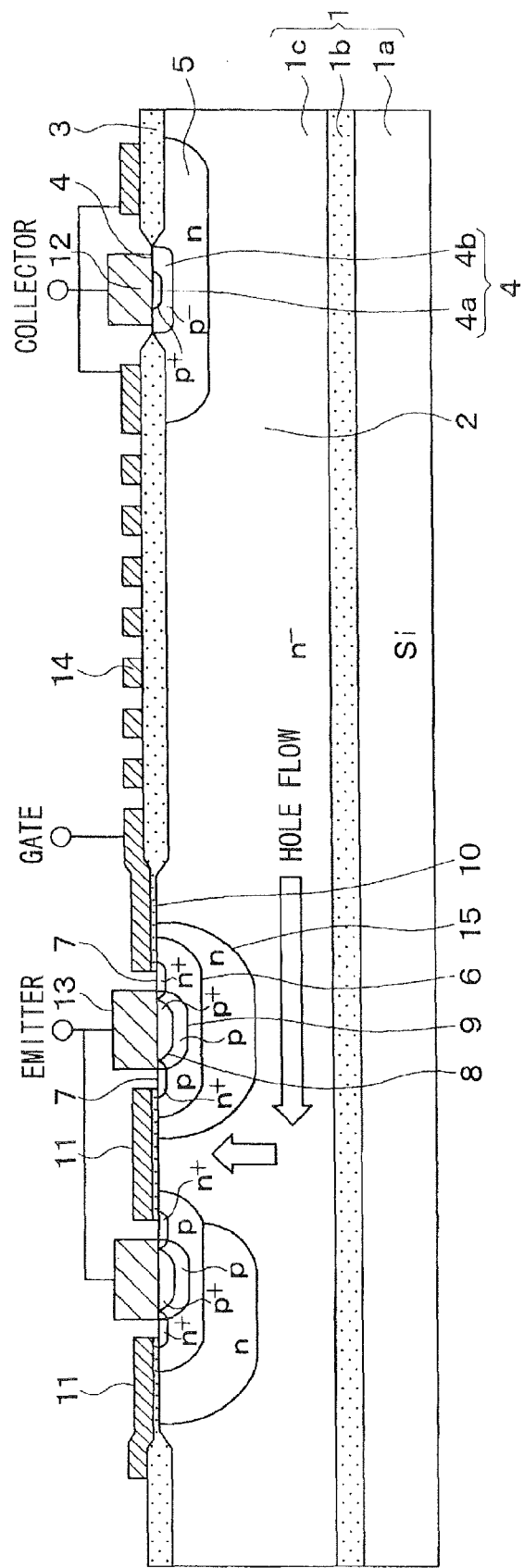
FIG. 22 is a cross-sectional view of a semiconductor device that includes a lateral IGBT according to a modification of the sixth embodiment.
Figure 23:
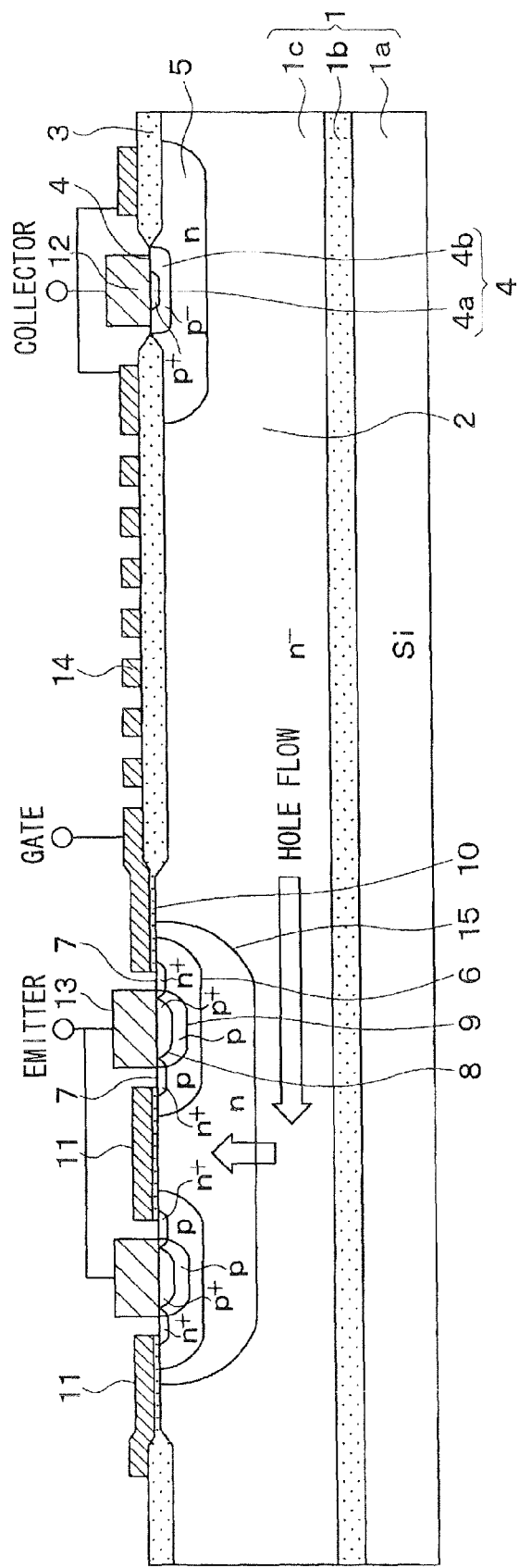
FIG. 23 is a cross-sectional view of a semiconductor device that includes a lateral IGBT according to another modification of the sixth embodiment.

In the lateral IGBT according to the sixth embodiment, the n type barrier layer 15 covers only an inner portion of the p channel p well layer 6 close to the collector region 4. The structures described in the modification of the third embodiment may also be applied to the sixth embodiment. In other words, the n type barrier layer 15 may also be formed to cover the channel p well layer 6 from the inner portion close to the collector region 4 to an outer portion far from the collector region 4 as shown in FIG. 22. The n type barrier layer 15 may also be formed to cover the adjacent two channel p well layers 6.

Also in the above-described configurations, the n type barrier layer 15 can function as a barrier of holes. Thus, the carrier concentration of the n− type drift layer 2 in the vicinity of the emitter can be increased, and the on-voltage can be further reduced. Furthermore, a parasitic npn transistor provided in the vicinity of the emitter does not operate easily, an increase in the switching time can be restricted.

Figure 21:
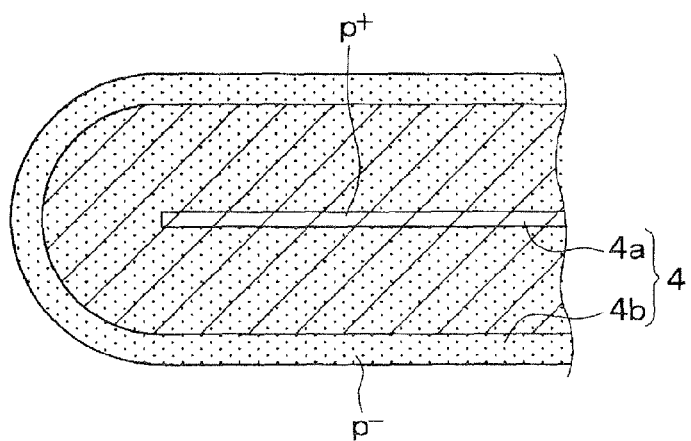
FIG. 21 is an enlarged view of a contact portion in the lateral IGBT according to the sixth embodiment.
Figure 24:
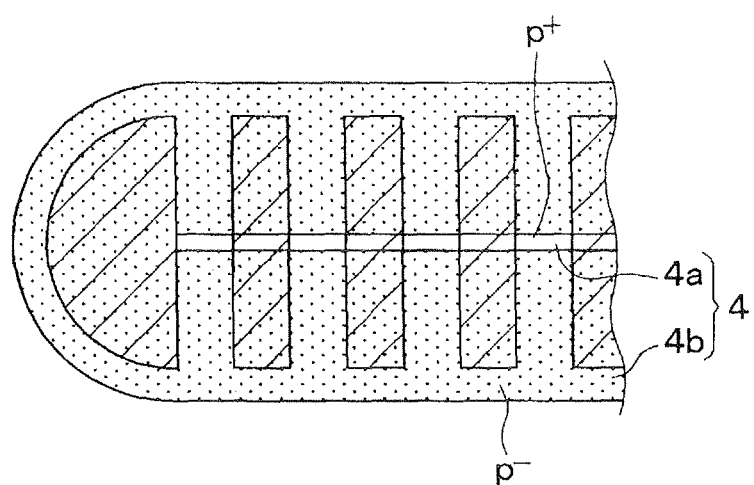
FIG. 24 is an enlarged view of a contact portion in a lateral IGBT according to another modification of the sixth embodiment.

In the lateral IGBT according to the sixth embodiment, as shown in FIG. 21, the contact portion of the collector region 4 with the collector electrode 12 has the band shape and is located almost in the whole area of the corrector region. The contact portion may also have other shape. For example, as shown in FIG. 24, the contact portion may be divided in a direction perpendicular to the longitudinal direction of the collector region 4, and the collector electrode 12 may also be in contact with the p+ type region 4a and the p− type region 4b in each contact portion. Also in this configuration, when the collector electrode 12 is formed so as to form an ohmic junction with the p+ type region 4a and to form a schottky junction with the p− type region 4b, the on-voltage can be reduced and the switching time can be reduced.

Seventh Embodiment

A semiconductor device including a lateral IGBT according to a seventh embodiment of the present invention will be described with reference to FIG. 25.

Figure 25:
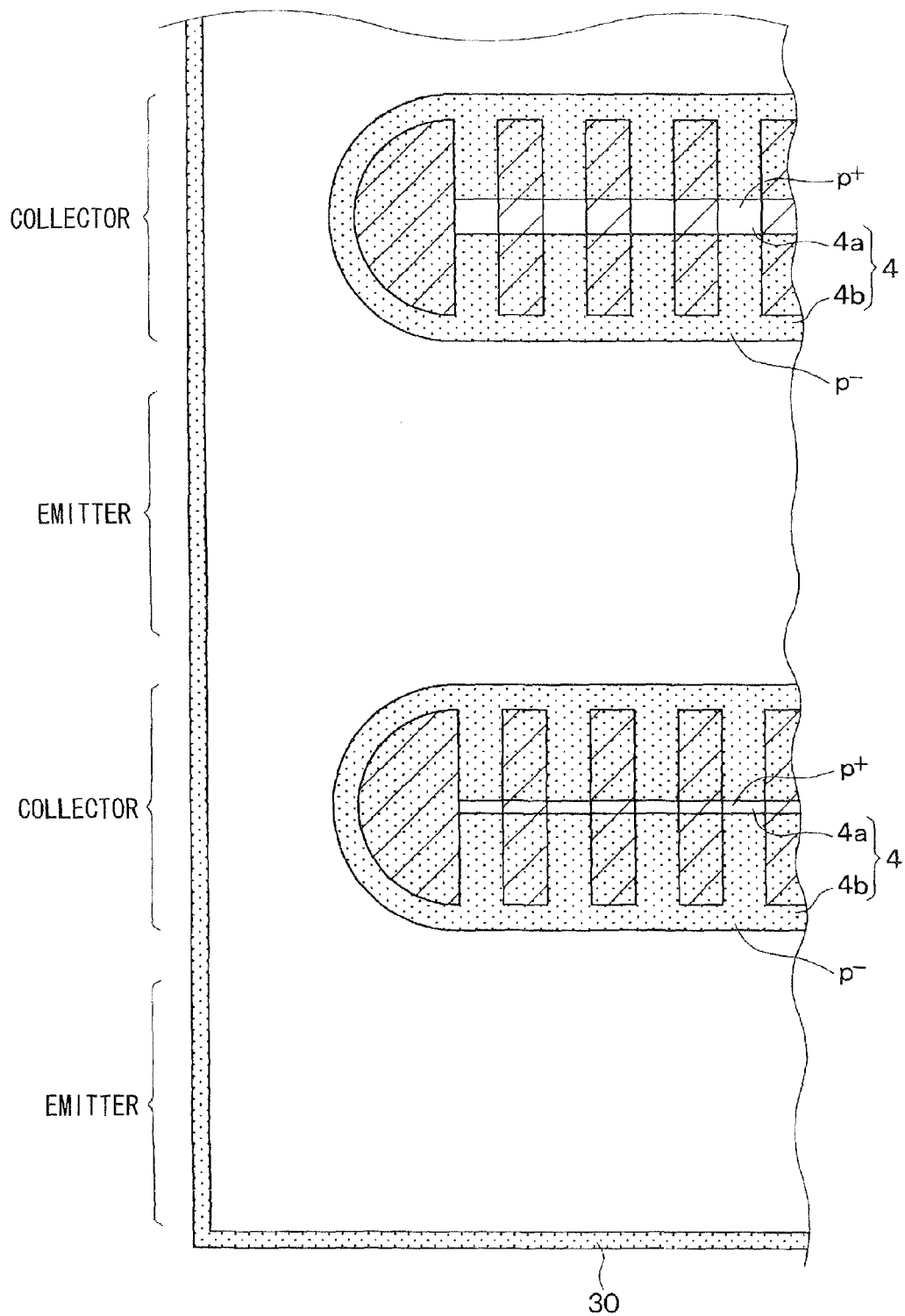
FIG. 25 is a diagram showing a top layout of a semiconductor device that includes a lateral IGBT according to a seventh embodiment of the present invention.

In FIG. 25, only a layout of the collector region 4 is shown to facilitate understanding characterizing portion. A structure in the vicinity of the emitter is similar to the sixth embodiment. A portion with a hatched pattern is a contact portion of the collector region 4 and the collector electrode 12.

In the semiconductor device, a plurality of cells of the lateral IGBT is arranged. The semiconductor device includes an element isolating part 30 that surrounds an element region in the active layer 1c, and the cells of the lateral IGBT are arranged in the element region. The element isolating part 30 includes, for example, a trench that penetrates the active layer 1c to the buried oxide layer 1b and an insulating layer embedded in the trench. The p+ type region 4a in one of the cells and the p+ type region 4a in another of the cells have different widths, that is, different surface areas. In FIG. 25, the cells are arranged in a direction perpendicular to the longitudinal direction of the collector region 4. The p+ type region 4a in an outer cell has a width less than a width of the p+ type region 4a in an inner cell.

In the present case, even when holes are easily stored in the outer cell in the plurality of cells, an injection of holes in the outer cell can be restricted more effectively than the other cells, and the breakdown endurance can be further improved.

In the above-described example, the width of the p+ type region 4a in the outer cell is set to be less than the width of the p+ type region 4a in the inner cell. However, the cells in which the p+ type regions 4a have different widths may be arranged at any portions in the element region.

Eighth Embodiment

A semiconductor device including a lateral IGBT according to an eighth embodiment of the present invention will be described with reference to FIG. 26.

Figure 26:
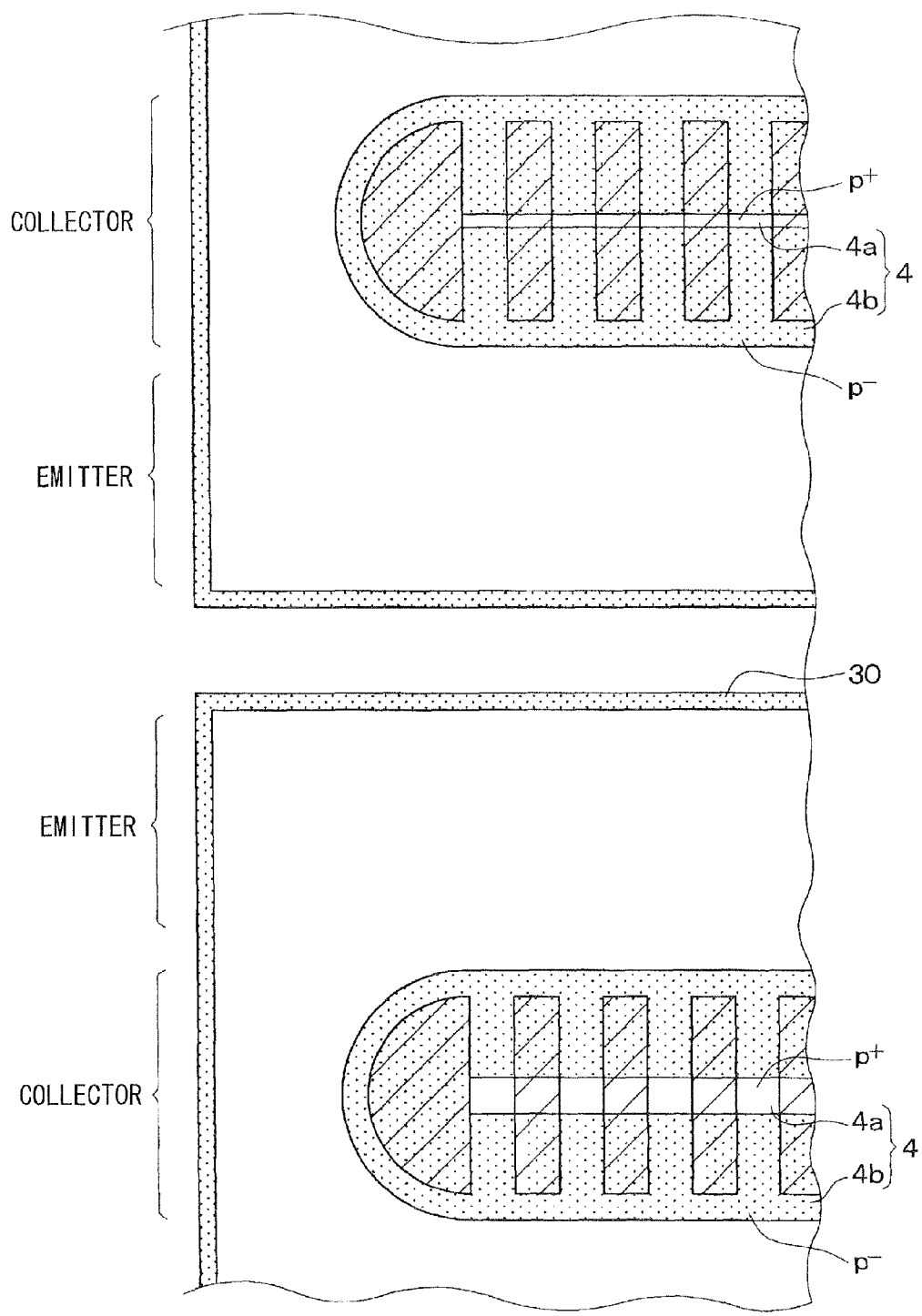
FIG. 26 is a diagram showing a top layout of a semiconductor device that includes a lateral IGBT according to an eighth embodiment of the present invention.

In FIG. 26, only a layout of the collector region 4 is shown to facilitate understanding characterizing portion. A structure in the vicinity of the emitter is similar to the sixth embodiment. A portion with a hatched pattern is a contact portion of the collector region 4 and the collector electrode 12.

As shown in FIG. 16, in one IC chip, the semiconductor device includes a plurality of element regions each isolated by an element isolating part 30. In each of the element regions, a plurality of cells is arranged. The p+ type regions 4a in the cells in one element region and the p+ type regions 4a in the cells in another element region have different widths, that is, different surface areas.

In the present case, a plurality of IGBTs having different relationships between an on-voltage and a switching time (falling time) can be formed in one IC chip. Thus, a loss optimization can be achieved in the whole chip.

All the p+ type regions 4a in the cells in one element region do not need to have the same width. For example, in a manner similar to the seventh embodiment, in a plurality of cells arranged in one element region, the width of the p+ type region 4a in an outer cell may also be less than the width of the p+ type region 4a in an inner cell.

Ninth Embodiment

A semiconductor device including a lateral IGBT according to a ninth embodiment of the present invention will be described with reference to FIG. 27. In the present embodiment, the configuration of the first embodiment and the configuration of the sixth embodiment are combined.

Figure 27:
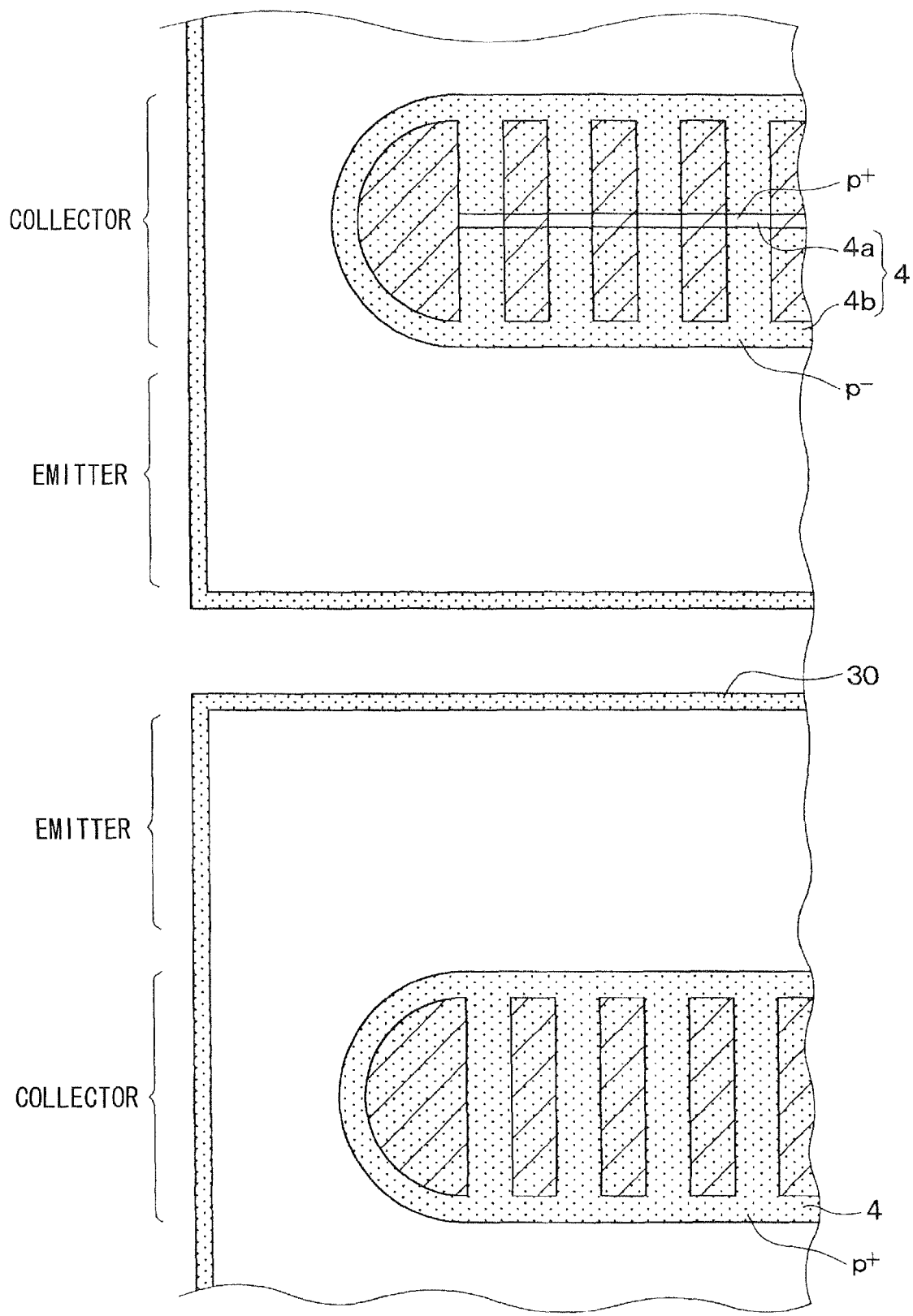
FIG. 27 is a diagram showing a top layout of a semiconductor device that includes a lateral IGBT according to a ninth embodiment of the present invention.

In FIG. 27, only a layout of the collector region 4 is shown to facilitate understanding characterizing portion. A structure in the vicinity of the emitter is similar to the sixth embodiment. A portion with a hatched pattern is a contact portion of the collector region 4 and the collector electrode 12.

As shown in FIG. 27, in one IC chip, the semiconductor device includes a plurality of element regions each isolated by an element isolating part 30. In one element region, the collector region 4 includes only the p+ type region in a manner similar to the first embodiment. In another element region, the collector region 4 includes the p+ type region 4a and the p− type region 4b in a manner similar to the sixth embodiment. Also by forming the collector regions 4 having different structures, a plurality of lateral IGBT having different relationships between an on-voltage and a switching time (falling time) can be formed. Thus, a loss optimization can be achieved in the whole chip.

When the semiconductor device includes the lateral IGBTs according to the first embodiment and the lateral IGBTs according to the sixth embodiment, the switching speed is reduced and the on-voltage is reduced compared with a case where the semiconductor device includes only the lateral IGBTs according to the sixth embodiment.

Other Embodiments

Although the present invention has been fully described in connection with the preferred embodiments thereof with reference to the accompanying drawings, it is to be noted that various changes and modifications will become apparent to those skilled in the art.

In the first embodiment, the resistive layer 14 is disposed so that the potential gradient can be uniform. However, the resistive layer 14 does not need to be disposed. In the first embodiment, an end of the resistive layer 14 far from the collector is coupled with the gate electrode 11 as an example. The end of the resistive layer 14 may also be coupled with the emitter electrode 13.

In the third embodiment, the trench 16 surrounds the whole circumference of the collector region 4 as an example. The trench 16 needs to be disposed at least between the n+ type emitter region 7 and the LOCOS oxide layer 3 and between the n+ type emitter regions 7 in adjacent cells, that is, at linear portions, and the trench 16 does not need to be disposed at corner portions.

Figure 28A:
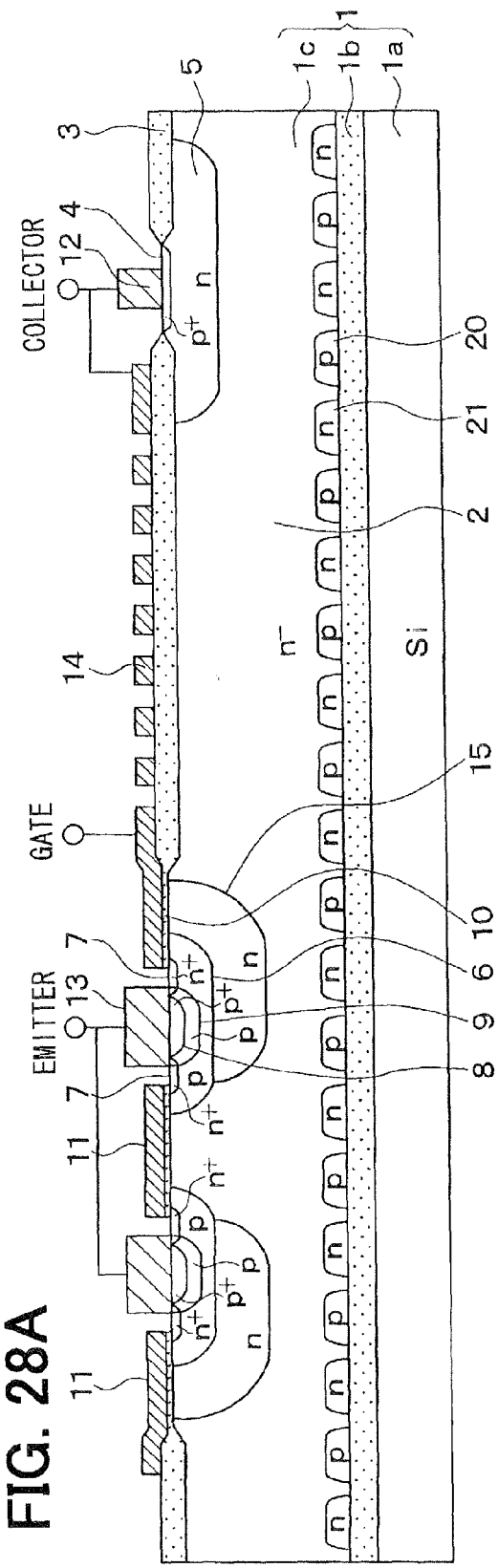
FIG. 28A is a cross-sectional view of a semiconductor device that includes a lateral IGBT according to another embodiment of the present invention.
Figure 28B:
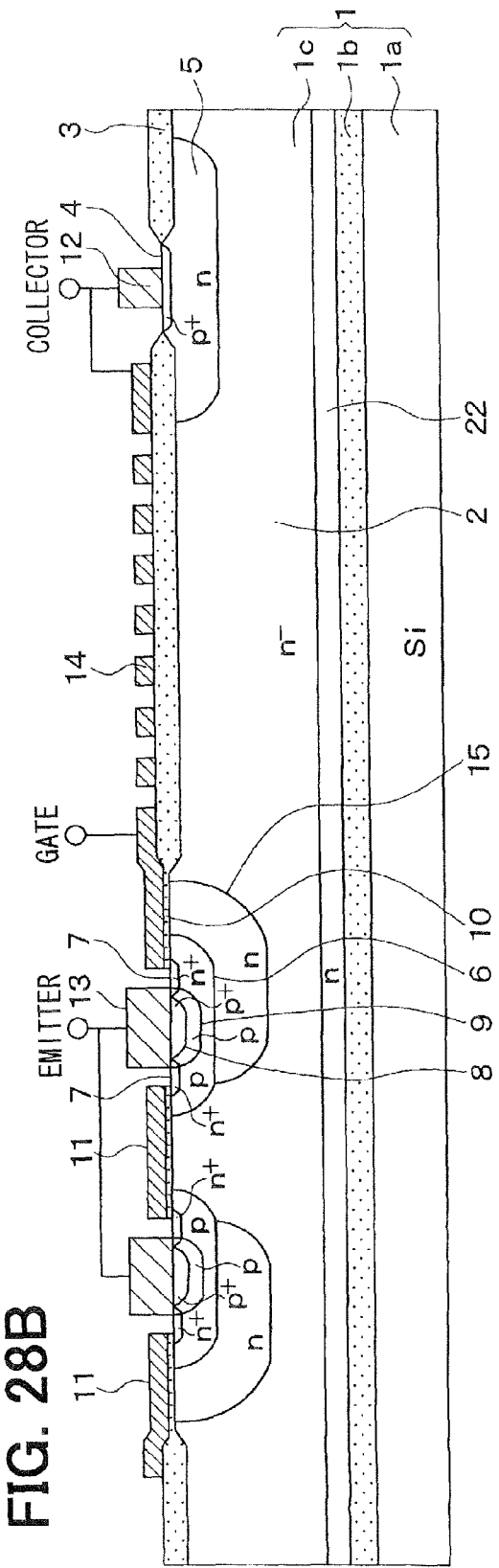
FIG. 28B is a cross-sectional view of a semiconductor device that includes a lateral IGBT according to another embodiment of the present invention.

In each of the above-described embodiments, a process for improving the breakdown voltage may also be treated on a surface of the active layer 1c being in contact with the buried oxide layer 1b, that is, on a rear surface of the active layer 1c. For example, as shown in FIG. 28A, a p type layer 20 and an n type layer 21 may be alternately arranged on the rear surface of the active layer 1c. Alternatively, as shown in FIG. 28B, an n type layer 22 having an impurity concentration higher than the n− type drift layer 2 may be disposed on the whole area of the rear surface of the active layer 1c. The p type layer 20 and the n type layer 21 in FIG. 28A and the n type layer 22 in FIG. 28B can be formed on the rear surface of the active layer 1c by ion implanting before the active layer 1c is attached to the support substrate 1a.

In each of the above-described embodiments, the lateral IGBT is an n channel type in which the first conductivity type is the n type and the second conductivity type is the p type as an example. The lateral IGBT may also be a p channel type in which a conductivity type of each component is inversed.

What is claimed is:

1. A lateral insulated gate bipolar transistor comprising:
a plurality of cells, each of the plurality of cells including:
a semiconductor substrate including a drift layer of a first conductivity type;
a collector region of a second conductivity type disposed in a surface portion of the drift layer, the collector region having a longitudinal direction in a predetermined direction;
a channel layer of the second conductivity type disposed in the surface portion of the drift layer, the channel layer including a linear portion extending along either side of the collector region;
an emitter region of the first conductivity type disposed in a surface portion of the channel layer, an end of the emitter region located inside an end of the channel layer, the emitter region including a linear portion that has a longitudinal direction in the predetermined direction;
a gate insulating layer disposed on a surface of the channel layer located between the emitter region and the drift layer;
a gate electrode disposed on a surface of the gate insulating layer;
a collector electrode electrically coupled with the collector region;
an emitter electrode electrically coupled with the emitter region and the channel layer; and
a barrier layer of the first conductivity type disposed along either side of the collector region, the barrier layer located to a depth deeper than a bottom of the channel layer, the barrier layer having a first conductivity-type impurity concentration that is higher than a first conductivity-type impurity concentration of the drift layer, the barrier layer having a first end close to the collector region and a second end far from the collector region, the first end located between the channel layer and the collector region, the second end located on the bottom of the channel layer, wherein
the plurality of cells includes a first cell and a second cell adjacent to each other,
the emitter region and the channel layer in the first cell are arranged along with the emitter region and the channel layer in the second cell,
the channel layer in the first cell is located at a predetermined distance from the channel layer in the second cell,
the barrier layer includes a linear portion that has a longitudinal direction in the predetermined direction,
the barrier layer further includes a corner portion that surrounds a longitudinal end of the collector region, and
the corner portion of the barrier layer has a first conductivity type impurity concentration that is lower than a first conductivity type impurity concentration of the linear portion of the barrier layer.

2. The lateral insulated gate bipolar transistor according to claim 1, wherein
the semiconductor substrate includes a support substrate, a buried oxide layer disposed on the support substrate, an active layer disposed on the buried oxide layer, a first conductivity type layer and a second conductivity type layer alternately arranged on a surface of the active layer being in contact with the buried oxide layer.

3. The lateral insulated gate bipolar transistor according to claim 1, wherein
the semiconductor substrate includes a support substrate, a buried oxide layer disposed on the support substrate, a first conductivity type layer disposed on the support substrate, and an active layer disposed on the first conductivity type layer.

4. The lateral insulated gate bipolar transistor according to claim 1, wherein
the collector region includes a high impurity concentration region and a low impurity concentration region, the high impurity concentration region has an impurity concentration higher than an impurity concentration of the low impurity concentration region, the collector electrode forms an ohmic junction with the high impurity concentration region, and the collector electrode forms a schottky junction with the low impurity concentration region.

5. The lateral insulated gate bipolar transistor according to claim 4, wherein the high impurity concentration region and the low impurity concentration region extend along the predetermined direction, the plurality of cells includes a third cell and a fourth cell, the high impurity concentration region in the third cell and the high impurity concentration region in the fourth cell have different widths.

6. The lateral insulated gate bipolar transistor according to claim 5, wherein the semiconductor substrate includes a plurality of element regions each surrounded by an element isolating part, and the third cell and the fourth cell are located in different element regions in the plurality element regions.

7. The lateral insulated gate bipolar transistor according to claim 4, wherein the plurality of cells includes a third cell and a fourth cell, the collector region in the third cell includes the high impurity concentration region and the low impurity concentration region, and the collector region in the fourth cell includes only a region that forms an ohmic junction with the collector electrode.

8. The lateral insulated gate bipolar transistor according to claim 1, wherein the barrier layer and the channel layer are different.

* * * * *